United States Patent
Chan et al.

(10) Patent No.: US 12,389,786 B2
(45) Date of Patent: Aug. 12, 2025

(54) UTILIZING MONOLAYER MOLECULAR CRYSTALS TO IMPROVE CONTACT PROPERTIES OF ORGANIC FIELD-EFFECT TRANSISTORS

(71) Applicant: THE UNIVERSITY OF HONG KONG, Hong Kong (CN)

(72) Inventors: Kwok Leung Chan, Hong Kong (CN); Boyu Peng, Hong Kong (CN)

(73) Assignee: The University of Hong Kong, Hong Kong (CN)

( * ) Notice: Subject to any disclaimer, the term of this patent is extended or adjusted under 35 U.S.C. 154(b) by 418 days.

(21) Appl. No.: 18/004,135

(22) PCT Filed: Jul. 7, 2021

(86) PCT No.: PCT/CN2021/104980
§ 371 (c)(1),
(2) Date: Jan. 3, 2023

(87) PCT Pub. No.: WO2022/007842
PCT Pub. Date: Jan. 13, 2022

(65) Prior Publication Data
US 2023/0269995 A1     Aug. 24, 2023

Related U.S. Application Data

(60) Provisional application No. 63/049,807, filed on Jul. 9, 2020.

(51) Int. Cl.
*H10K 71/15* (2023.01)
*H10K 10/46* (2023.01)
(Continued)

(52) U.S. Cl.
CPC .......... *H10K 71/15* (2023.02); *H10K 10/484* (2023.02); *H10K 71/60* (2023.02); *H10K 10/84* (2023.02);
(Continued)

(58) Field of Classification Search
None
See application file for complete search history.

(56) References Cited

U.S. PATENT DOCUMENTS

2011/0312125 A1    12/2011  Nomoto

FOREIGN PATENT DOCUMENTS

| CN | 108475644 A | 8/2018 |
|---|---|---|
| EP | 3 301 207 A1 | 4/2018 |

OTHER PUBLICATIONS

International Search Report dated Oct. 9, 2021 in International Application No. PCT/CN2021/104980.
(Continued)

*Primary Examiner* — Anthony Ho
(74) *Attorney, Agent, or Firm* — SALIWANCHIK, LLOYD & EISENSCHENK

(57) ABSTRACT

A method for manufacturing a semiconductor device having an organic semiconductor material is provided. The method includes performing a large-area solution shearing step to form a monolayer (1L) or bi-layer (2L) $C_{10}$-DNTT crystals with low shearing speed and forming Au electrodes by thermal evaporation on a wafer. The large-area solution shearing step is performed at a temperature in a range between about 60° C. and about 65° C. and with a shearing speed in a range between about 2 μm/s and about 3 μm/s. The 1L or 2L crystals have single-crystalline domains extending over several millimeters. An organic field-effect transistor (OFET) comprising an active layer that comprises a mono-
(Continued)

layer (1L) or bi-layer (2L) $C_{10}$-DNTT crystals formed according to the method is also provided.

23 Claims, 47 Drawing Sheets

(51) Int. Cl.
*H10K 71/60* (2023.01)
*H10K 10/84* (2023.01)
*H10K 85/60* (2023.01)
*H10K 102/20* (2023.01)

(52) U.S. Cl.
CPC ..... *H10K 85/6576* (2023.02); *H10K 2102/20* (2023.02)

(56) References Cited

OTHER PUBLICATIONS

Wang, W., "Fabrication of Large-Area Benzothiophenes Crystalline Thin Films for High-Performance Filed-Effect Transistors," Chinese Doctoral Dissertations & Master's Theses Full-text Database, Apr. 30, 2020, 4:1-90.

UTILIZING MONOLAYER MOLECULAR CRYSTALS TO IMPROVE CONTACT PROPERTIES OF ORGANIC FIELD-EFFECT TRANSISTORS

This application is the U.S. national stage application of International Patent Application No. PCT/CN2021/104980, filed Jul. 7, 2021, which claims the benefit of U.S. Provisional Patent Application No. 63/049,807, filed Jul. 9, 2020, the entire content of which is incorporated by reference for all purpose.

FIELD OF THE INVENTION

The field of the invention is generally related a method for manufacturing a semiconductor device having an organic semiconductor material and an organic field-effect transistor (OFET) manufactured according to the method.

BACKGROUND OF THE INVENTION

Organic semiconductor (OSC) materials are essential components in various emerging applications including organic field-effect transistors (OFETs), organic light-emitting diodes (OLEDs), and organic photovoltaics (OPVs). In all of these devices, efficient charge transport across metal-semiconductor (M/S) interfaces determines to a great extent the device performance such as on-state current and transit frequency of transistors, external quantum efficiency of OLEDs, or power conversion efficiency of solar cells.

Generally, when a metal forms a contact with the semiconductor, a Schottky barrier is induced due to the misalignment between the metal work function and the transport energy levels in the semiconductor. The Schottky barrier blocks the current flow across the metal-semiconductor interface to a certain extent.[1] This issue gets particularly severe at metal-OSC (M/OSC) interfaces due to the abrupt difference in carrier density, the large density of interfacial traps, or the Fermi-level pinning effect.[2] The Schottky M/OSC contacts may induce potential drops at the contacts that restrict a high-power operation, non-linear charge injection, as well as potential device-to-device variations.[3-7] For OFETs, the Schottky contacts would result in large (>1 kΩ·cm) and bias-dependent contact resistance ($R_c$) that are the major bottlenecks to further increase the apparent mobility and down-scaling the dimensions of the OFETs.

To address these arduous challenges, Ohmic contacts at M/OSC interfaces with small (<100 Ω·cm) and bias-independent $R_c$ are investigated. The conductive channel in an OFET is confined in the first few molecular layers (MLs) near the dielectric-semiconductor interface.[8] In the devices with staggered structure, the contact resistance has two major components: (i) the resistance at the M/OSC interface (referred to as $R_{int}$), and (ii) the resistance across the OSC layer (namely the access resistance, $R_a$).[9] Unlike the conventional amorphous organic thin films, crystalline organic semiconductor with regular lattice structure and molecularly flat surfaces is an excellent candidate for developing closely-packed interfaces with the metal electrodes.[10,11] Various approaches have been studied to improve the $R_{int}$ in at M/OSC interfaces, including tuning the work function of metal electrodes by using oxidation,[12] forming self-assembled monolayers or inserting thin layers with large dipole moments,[13-16] and employing thin layers for Fermi-level depinning.[17,18]

By utilizing these approaches, the $R_{int}$ was improved by orders of magnitudes, associated with outstanding device mobility up to 10-15 cm$^2$V$^{-1}$s$^{-1}$. On the other hand, however, the $R_a$ has much lower tunability and rapidly increases with the number of MLs in the semiconductor.[13] Due to the potentially large density of trap states and defects, it has been presumed that OFETs with a monolayer channel should have lower performance than devices with thicker channels that have thickness ranging from a few to tens of MLs.[15] However, if the defects or traps in the organic crystals are well controlled during the deposition and become negligible, organic monolayer (1L) films with excellent in-plane crystallinity may the most feasible solution for realizing Ohmic contacts in OFETs.

BRIEF SUMMARY OF THE INVENTION

There continues to be a need in the art for improved designs and techniques for a method for forming organic monolayer (1L) films with excellent in-plane crystallinity to improve contact properties of OFETs.

According to an embodiment of the subject invention, a method for forming organic monolayer (1L) films for manufacturing a semiconductor device is provided. The method can comprise performing a large-area solution shearing step to form a monolayer (1L) or bi-layer (2L) $C_{10}$-DNTT crystals with low shearing speed. The large-area solution shearing step is performed at a temperature in a range between about 60° C. and about 65° C. and with a shearing speed in a range between about 2 μm/s and about 3 μm/s. The 1L or 2L crystals have single-crystalline domains extending over several millimeters. Moreover, an organic field-effect transistor (OFET) comprising an active layer that comprises a monolayer (1L) or bi-layer (2L) $C_{10}$-DNTT crystals formed according to the method is also provided.

The present invention comprises following embodiments.

1. A method for manufacturing a semiconductor device having an organic semiconductor material, the method comprising:
    performing a large-area solution shearing step to form a monolayer (1L) or bi-layer (2L) $C_{10}$-DNTT crystals with low shearing speed; and
    transferring Au electrodes onto the 1L or 2L $C_{10}$-DNTT crystals to build metal/semiconductor interfaces free of thermal damage.

2. The method of embodiment 1, wherein the large-area solution shearing step is performed at a temperature in a range between about 60° C. and about 65° C.

3. The method of embodiment 1 or 2, wherein the solution shearing is performed with both a shearing blade and a substrate heated to maintain a uniform temperature within the solution.

4. The method of embodiment 3, wherein the blade is an OTS-treated blade and/or the substrate is a PTS-treated substrate.

5. The method of any one of embodiments 1-4, wherein an organic semiconductor solute is dissolved at a temperature of about 65° C. in 1,2,3,4-tetrahydronaphthalene solvent with a concentration of 0.2 mg/ml to form the solution.

6. The method of embodiment 5, wherein the solution is injected between a substrate and a blade.

7. The method of any one of embodiments 1-6, wherein the large-area solution shearing step is performed with a shearing speed in a range between about 2 μm/s and about 3 μm/s.

8. The method of any one of embodiments 1-7, wherein the 1L or 2L crystals have single-crystalline domains extending over several millimeters.

9. The method of any one of embodiments 1-8, wherein the Au electrodes are transferred onto the 1L or 2L $C_{10}$-DNTT crystals by thermal evaporation.

10. The method of any one of embodiments 1-8, wherein the Au electrodes are transferred onto the 1L or 2L $C_{10}$-DNTT crystals by a polymethyl methacrylate (PMMA) stamp.

11. An organic field-effect transistor (OFET), comprising an active layer comprising a monolayer (1L) or bi-layer (2L) $C_{10}$-DNTT crystals formed according to the method of embodiment 1.

12. The OFET of embodiment 11, wherein the OFET is constructed so that a channel length is along an a-axis of the monolayer (1L) or bi-layer (2L) $C_{10}$-DNTT crystals.

13. The OFET of embodiment 12, wherein the channel length of the OFET is in a range of 8 µm to 140 µm.

14. The OFET of any one of embodiments 11-13, wherein the large-area solution shearing step is performed at a temperature in a range between about 60° C. and about 65° C.

15. The OFET of any one of embodiments 11-14, wherein the solution shearing is performed with both a shearing blade and a substrate heated to maintain a uniform temperature within the solution.

16. The OFET of embodiment 15, wherein the blade is an OTS-treated blade and/or the substrate is a PTS-treated substrate.

17. The OFET of any one of embodiments 11-16, wherein an organic semiconductor solute is dissolved at a temperature of about 65° C. in 1,2,3,4-tetrahydronaphthalene solvent with a concentration of 0.2 mg/ml to form the solution.

18. The OFET of embodiment 17, wherein the solution is injected between the substrate and the blade.

19. The OFET of any one of embodiments 11-18, wherein the large-area solution shearing step is performed with a shearing speed in a range between about 2 µm/s and about 3 µm/s.

20. The OFET of any one of embodiments 11-19, wherein the 1L or 2L crystals have single-crystalline domains extending over several millimeters.

21. The OFET of any one of claims 11-20, further comprising Au electrodes transferred onto the 1L or 2L $C_{10}$-DNTT crystals.

22. The OFET of embodiment 21, wherein the Au electrodes are transferred onto the 1L or 2L $C_{10}$-DNTT crystals by thermal evaporation.

23. The OFET of embodiment 21, wherein the Au electrodes are transferred onto the 1L or 2L $C_{10}$-DNTT crystals by a polymethyl methacrylate (PMMA) stamp.

DETAILED DISCLOSURE OF THE INVENTION

Solution-processed 1L-crystals of 2,9-didecyldinaphtho[2,3-b:2',3'-f]thieno[3,2-b]thiophene ($C_{10}$-DNTT) are employed as the active layers in OFETs. By fabricating the OFETs within one single-crystalline domain, the grain boundary effects of devices are eliminated.

The non-destructive deposition of the metal contacts and molecularly flat interface between the Au electrodes and the 1L-crystals leads to Ohmic-contact properties with $R_c$ as small as 40 Ω·cm, while the thermally evaporated Au electrodes show orders of magnitudes higher $R_c$. For the 1L-devices with transferred electrodes, the $R_c$ shows no dependency on the drain-source voltage and temperature when the $V_{DS}$ is between 0 to −1V and temperature is between 100 K to 300 K.

The Ohmic contacts of the embodiments of the subject invention are advantageous over 1L-OFETs of Schottky contacts. The alkyl side chains of the OSC molecules may establish thin tunneling barriers that facilitate the depinning of the Fermi level at the M/OSC interfaces and the direct tunneling of the carriers. The superior contact properties allow the 1L-OFETs to operate at $V_{DS}$ down to −0.1 mV without affecting the effective carrier mobility. With the intrinsic mobility of 12.5 $cm^2V^{-1}s^{-1}$ and a small $R_c$, high-field and high-current operations of OFETs are further investigated. A width-normalized on-current density of 4.2 μA/μm, which is greater than results previously reported for the conventional OFETs, can be achieved by the monolayer-OFETs.

When the term "about" is used herein, in conjunction with a numerical value, it is understood that the value can be in a range of 90% of the value to 110% of the value, i.e. the value can be +/−10% of the stated value. For example, "about 1 kg" means from 0.90 kg to 1.1 kg.

Contact Resistance of 1L and 2L-OFETs

Both monolayer (1L) and bi-layer (2L) $C_{10}$-DNTT crystals are obtained by a large-area solution shearing method with low shearing speed (see details in Experimental Section) for several reasons. Firstly, the $C_{10}$-DNTT offers decent mobility and stability. Secondly, the enhanced solubility induced by the alkyl chains can facilitate the solution-processing approaches. Thirdly, the considerably lower interlayer adhesion compared with intralayer π-π overlapping allows formation of crystals with high aspect ratios, such as 1L or 2L crystals, while under low-speed shearing and well controlled solvent evaporation.

With a precise control of the temperature in a range from about 60° C. to about 65° C. and the shearing speed in a range from about 2 μm/s to about 3 μm/s, the 1L and 2L crystals with single-crystalline domains can extend over several millimeters can be achieved.

Figure 1A:
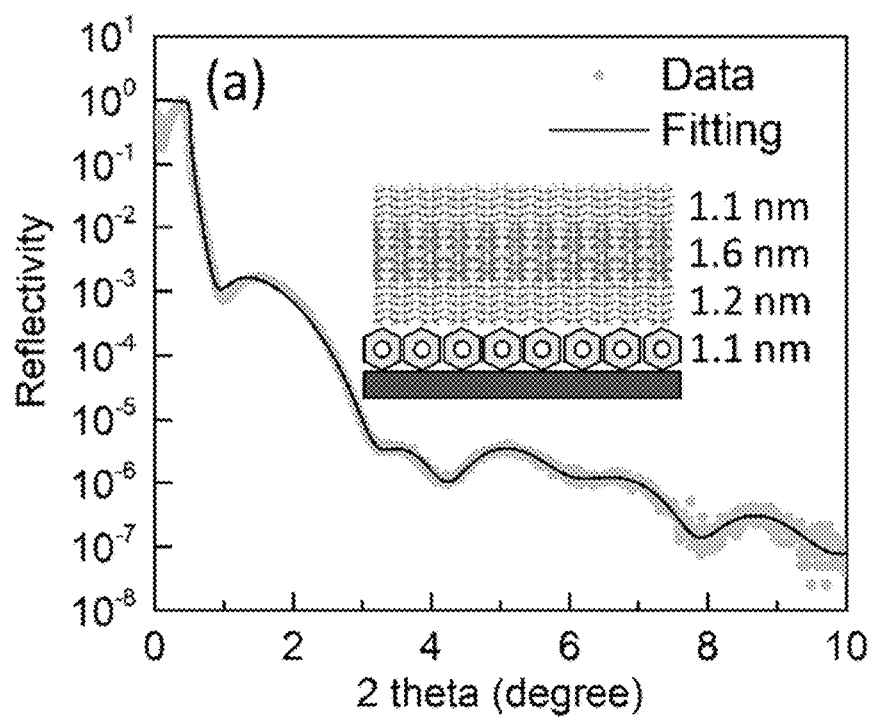
FIG. 1A shows measurements results of X-ray reflectivity of the 1L $C_{10}$-DNTT crystals, the solid line and the inset sublayer structures being fitted by software such as GenX, according to an embodiment of the subject invention.
Figure 6:
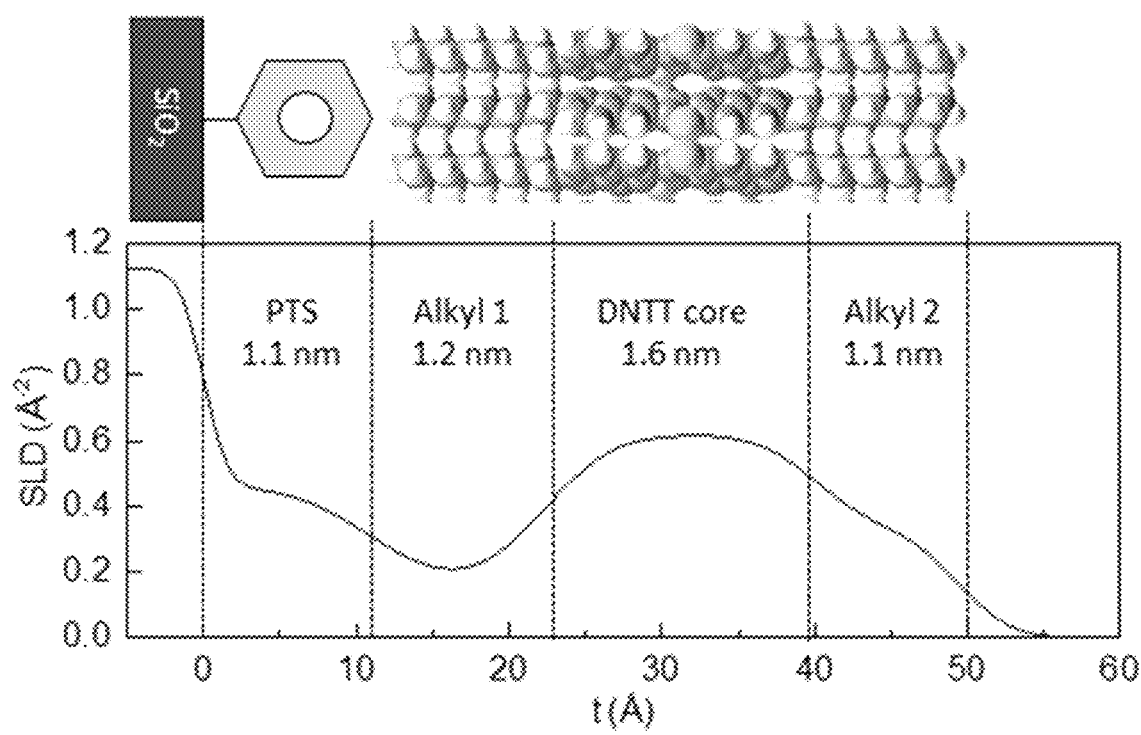
FIG. 6 shows scattering length density fitted by GenX software with a figure of merit (FOM) value smaller than 0.08, wherein the thickness of each sublayer can be estimated based on the change in SLD, according to an embodiment of the subject invention.
Figure 7A:
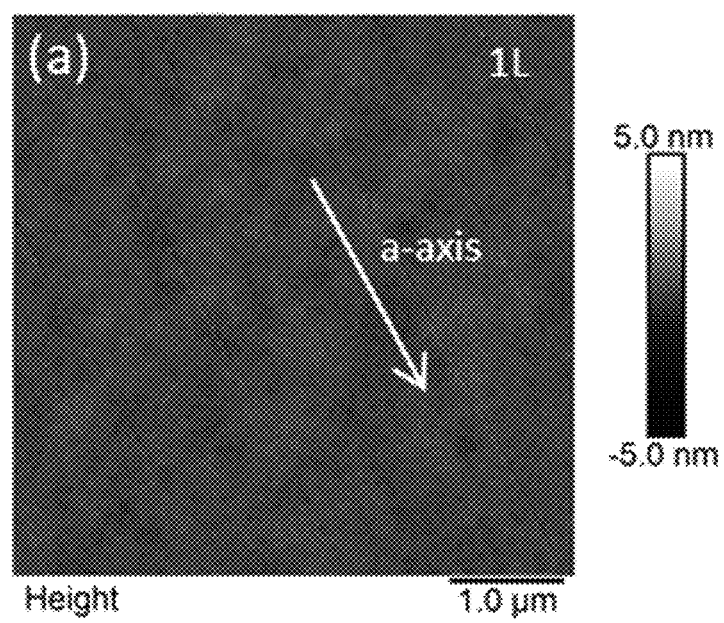
FIG. 7A shows an atomic force microscopy (AFM) surface scan of the 1L-crystal wherein the white arrow denotes the a-axis of the crystal, according to an embodiment of the subject invention.
Figure 7B:
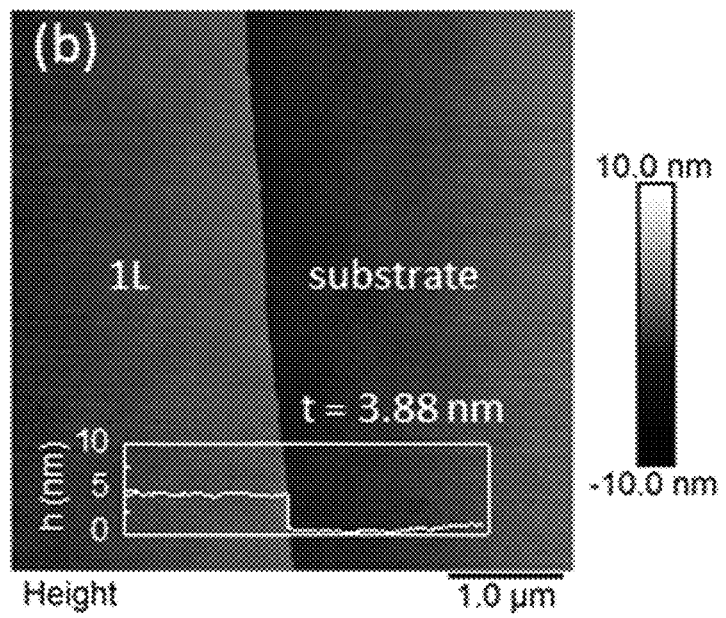
FIG. 7B shows an AFM scan of a 1L-crystal edge, according to an embodiment of the subject invention.
Figure 7C:
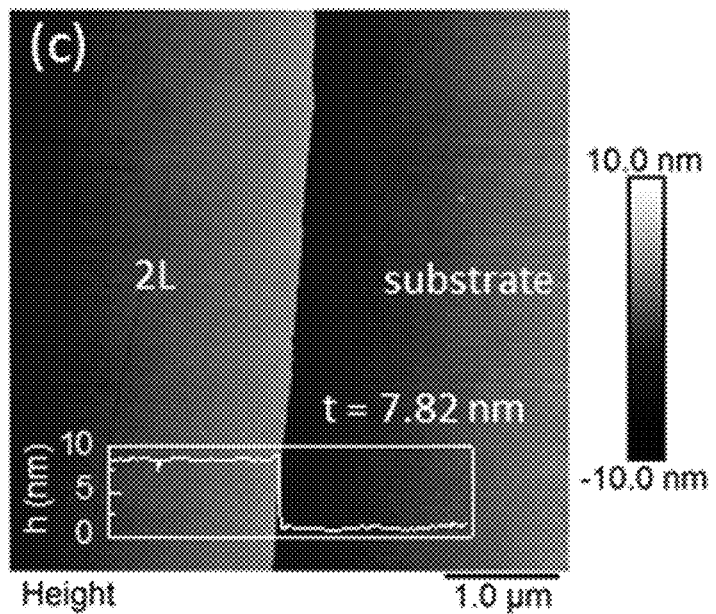
FIG. 7C shows an AFM scan of a 2L-crystal edge, according to an embodiment of the subject invention.

The structural information of the 1L-crystals obtained is measured by X-ray Reflectivity (XRR) and shown in FIG. 1A. Software such as GenX is utilized to perform fittings on the molecular structure of the 1L-crystal together with the self-assembled monolayer (SAM). The fitted curve is plotted in FIG. 1A and corresponding distribution of scattering length density (SLD) can be found in FIG. 6. The upper alkyl chains, lower alkyl chains, and the SAM layers may have thickness of about 1.1 nm, about 1.2 nm, and about 1.1 nm, respectively. The semiconducting core (same as DNTT) has a thickness of about 1.6 nm and the conductive channel for the accumulated charges to transport has a thickness of about 1.6 nm ($t_{ch}$=1.6 nm). The atomic force microscopy (AFM) image shows a flat surface with $R_q$=0.25 nm of the 1L-crystal in FIG. 7A. The thicknesses of the 1L and 2L crystals are measured to be 3.88 and 7.82 nm, respectively, which are confirmed by the step height at the edge of the crystals as shown in FIGS. 7B and 7C.

Figure 8A:
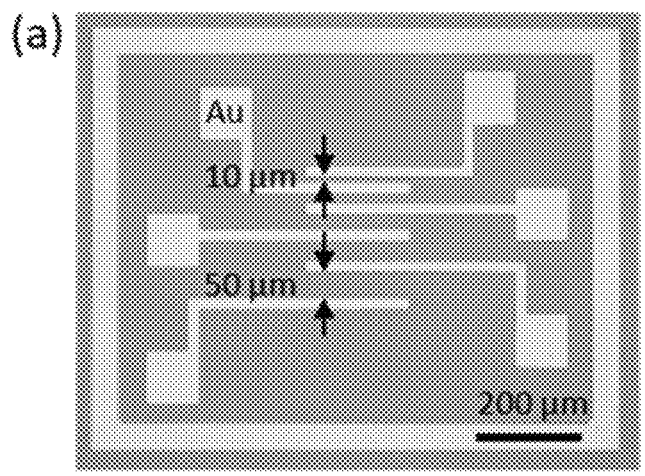
FIG. 8A shows optical images of the OFETs for TLM with evaporated Au electrodes, according to an embodiment of the subject invention.

With such thin crystals as the active layer of the OFETs, it is more challenging for the deposition of electrodes. The thermally evaporated metal electrodes have sufficient energy to penetrate into the semiconductor films and distort the molecular packing. FIG. 8A shows optical images of the OFETs for TLM with evaporated Au electrodes.

Figure 8B:
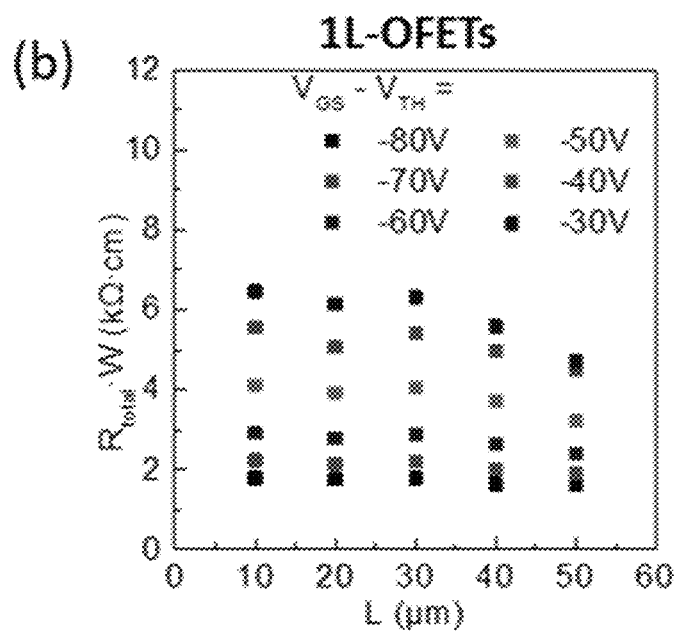
FIG. 8B shows TLM plots for 1L-OFETs in the configuration shown in FIG. 8A, according to an embodiment of the subject invention.
Figure 8C:
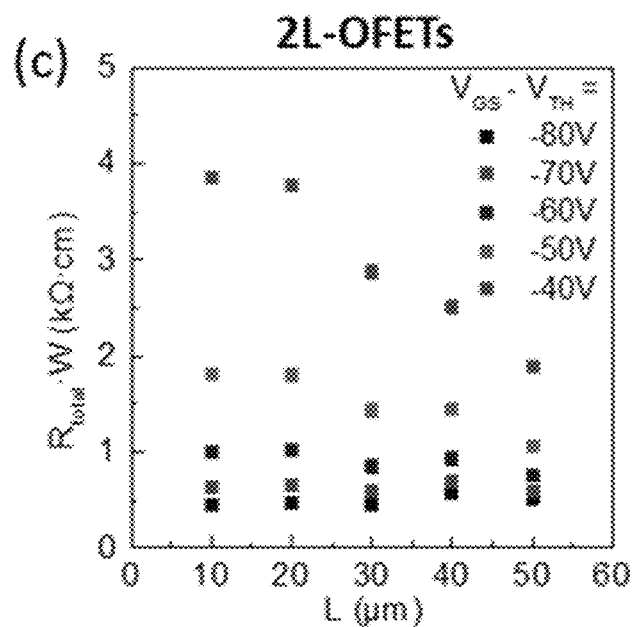
FIG. 8C shows TLM plots for 2L-OFETs in the configuration shown in FIG. 8A, according to an embodiment of the subject invention.

When the transmission length method (TLM) characterization which is governed by Equation (1) and Equation 2 is applied to the 1L and 2L-OFETs, the width-normalized total resistance ($R_{tot} \cdot W$) does not follow typical trends in TLM studies as shown in FIGS. 8B and 8C.

$$R_{tot}W = R_c W + \frac{L}{\mu_0 C(V_G - V_{TH})} = W(R_c + R_{ch}) \quad (1)$$

$$I_{DS} = \frac{W}{L} \mu_{app} C_i \left( V_{GS} - V_{TH} - \frac{V_{DS}}{2} \right) V_{DS} \quad (2)$$

By shortening the channel length, the total width-normalized resistance stays the same at higher overdrive voltage $V_{ov}=V_G-V_{TH}$ (for example, −80 V), or even becomes larger at lower $V_{ov}$ (for example, −40 V), suggesting that the contact resistance dominates over the channel resistance ($R_{ch} \cdot W$) and the data is not suitable for TLM fitting.

Figure 1B:
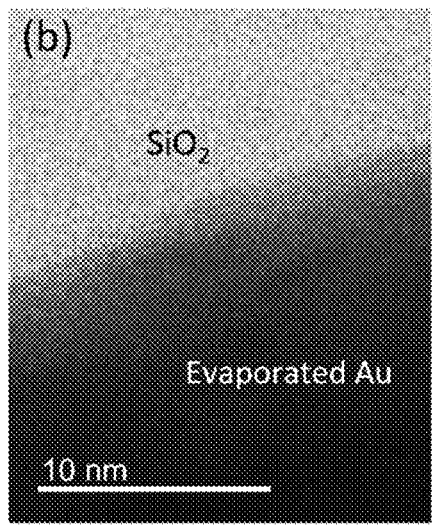
FIG. 1B is a cross-sectional transmission electron microscopy (TEM) image of the 1L crystal with evaporated Au as electrodes, with no obvious thin layer structures being detected, according to an embodiment of the subject invention.
Figure 8D:
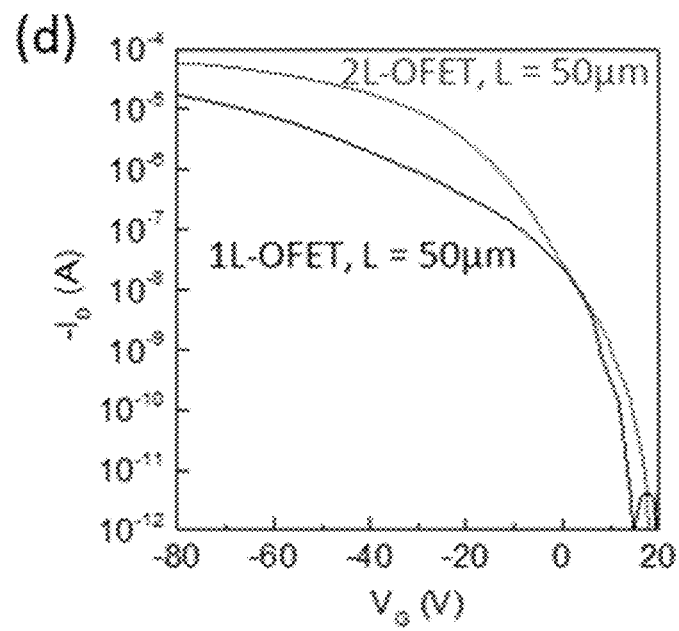
FIG. 8D shows transfer curves of the 1L and 2L-devices with longest channel (50 μm) at $V_{DS}$=−1 V, according to an embodiment of the subject invention.
Figure 8E:
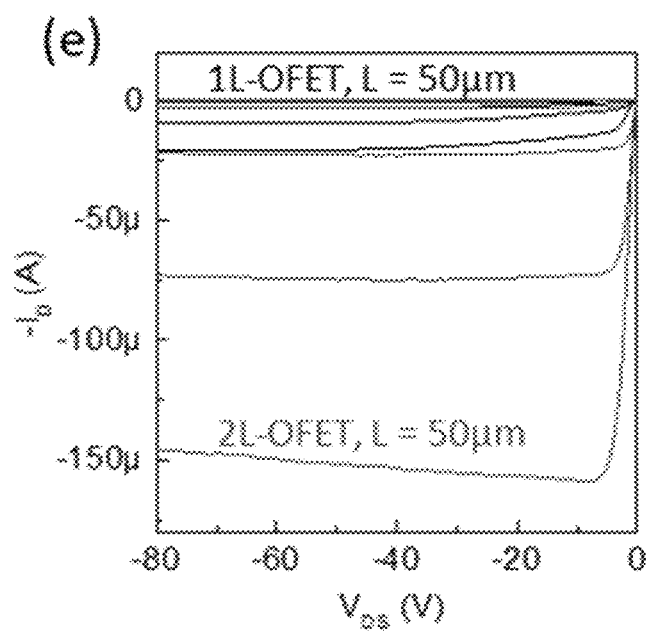
FIG. 8E shows output curves of the 1L and 2L-devices in FIG. 8D, according to an embodiment of the subject invention.

FIG. 8D shows transfer curves of the 1L and 2L-devices with longest channel (50 μm) at $V_{DS}=-1$ V. Even the output curves of the device having the longest channel (for example, 50 μm as channel length) still show a clear contact-limited behavior in FIG. 8E. The drain-source current ($I_D$) is restricted by the poor injection from the source electrodes and independent of the channel resistance. This is further confirmed by the cross-sectional transmission electron microscopy (TEM) image in FIG. 1B, where the evaporated Au penetrates the organic layer and directly contacts the $SiO_2$ substrate even at a low deposition speed of 0.2 Å/s.

Figure 1C:
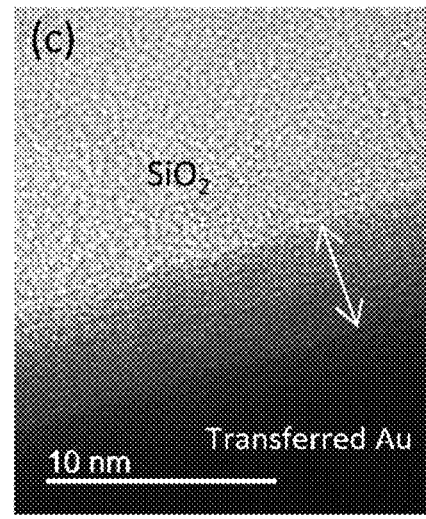
FIG. 1C is a cross-sectional TEM image of the 1L crystal with transferred Au as electrodes, the self-assembled monolayer (SAM) and 1L crystal together having a total thickness of 5 nm, according to an embodiment of the subject invention.

The continuous organic semiconductor layer is not recognizable in the TEM image. To address this issue, the patterned Au source-drain electrodes are pre-deposited, and mechanically laminated onto the 1L and 2L-crystals. As a result, a continuous 1L-crystal in addition to the SAM with a sharp interface between the Au electrodes is detected in FIG. 1C. The clear interface confirms that the transferred Au electrodes form physical contacts conformal to the ultra-flat 1L-crystal without thermal damages.

Figure 2A:
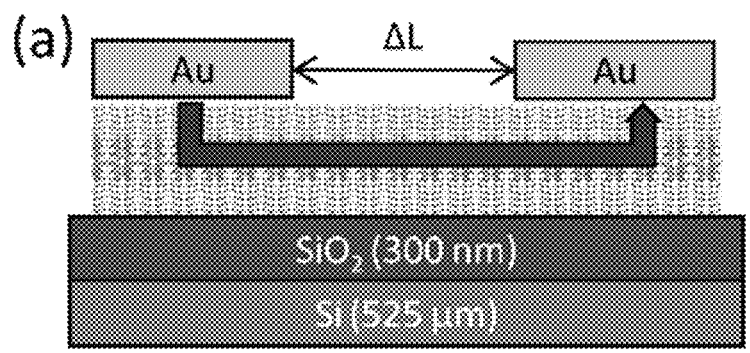
FIG. 2A is a schematic representation of cross-sections of bottom-gate, top-contact (BGTC) OFETs based on a 1L crystal, according to an embodiment of the subject invention.
Figure 2B:
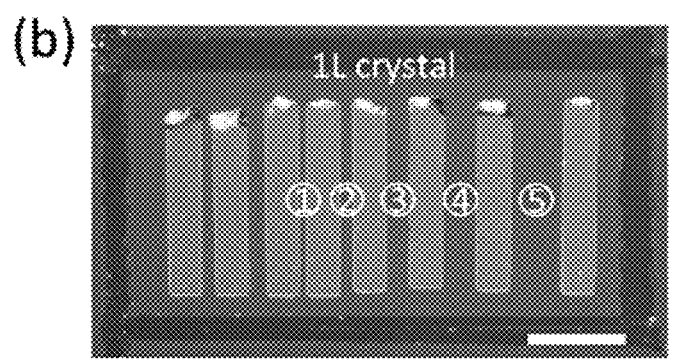
FIG. 2B are cross-polarized optical-microscopy (CPOM) images of the OFETs fabricated by transferring Au source and drain electrodes (electrode dimensions: 200 µm×35 µm) onto a 1L crystal of the organic semiconductor, according to an embodiment of the subject invention.
Figure 2C:
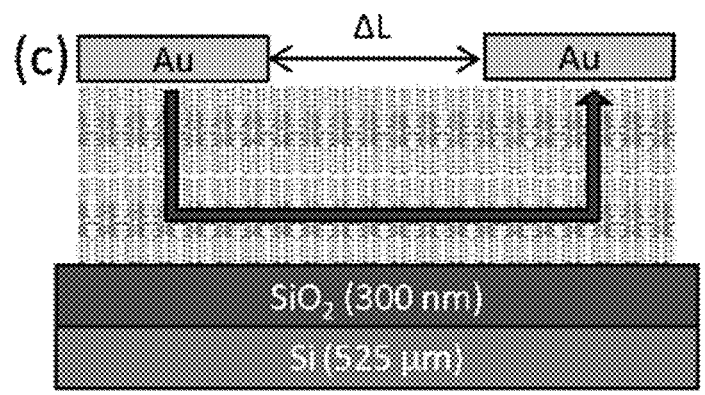
FIG. 2C is a schematic representation of cross-sections of bottom-gate, top-contact (BGTC) OFETs based on a bi-layer (2L) crystal of $C_{10}$-DNTT as the active semiconductor layer, according to an embodiment of the subject invention.
Figure 2D:
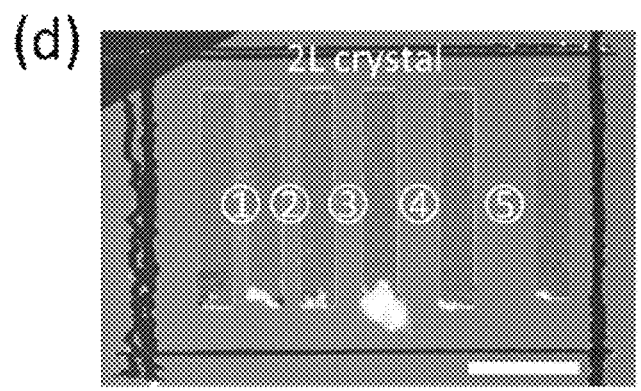
FIG. 2D are cross-polarized optical-microscopy (CPOM) images of OFETs fabricated by transferring Au source and drain electrodes (electrode dimensions: 200 µm×35 µm) onto a 2L crystal of the organic semiconductor, according to an embodiment of the subject invention.
Figure 9:
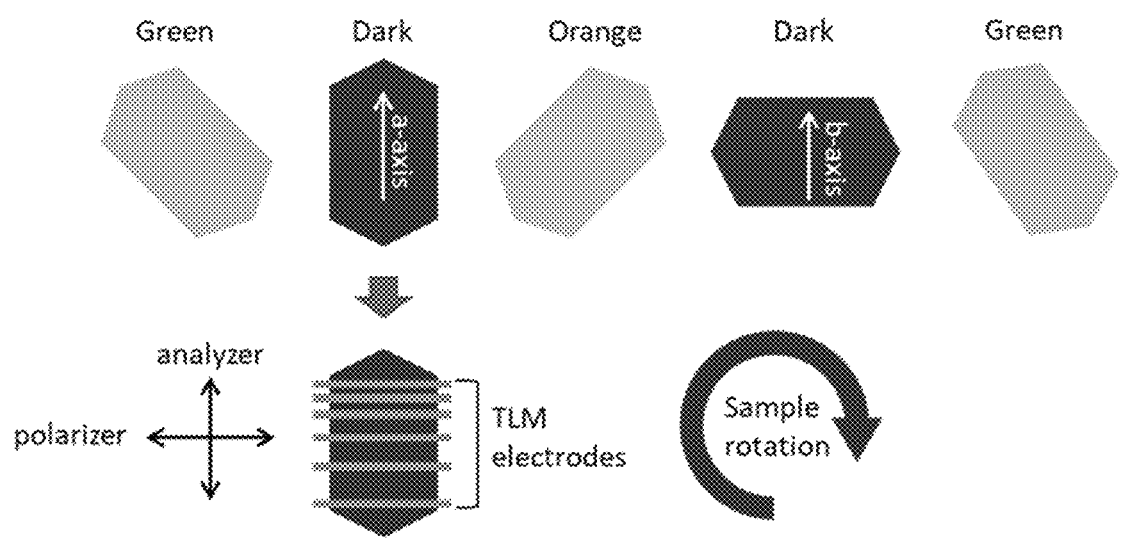
FIG. 9 shows the 1L and 2L-crystals with periodically light and dark transitions under POM, the crystal appears dark when a-axis being in parallel with the polarizer or analyzer, the dark state close to the shearing direction being determined as a-axis, according to an embodiment of the subject invention.
Figure 10A:
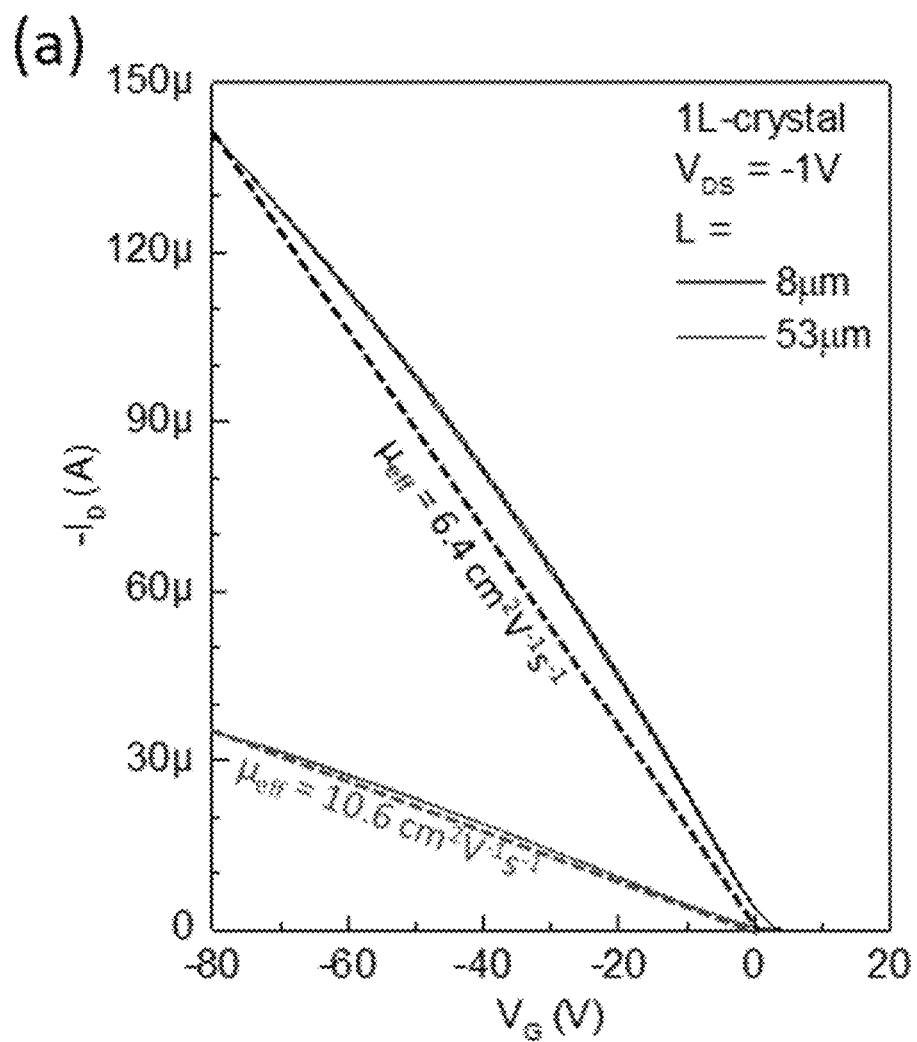
FIG. 10A shows transfer curves of 1L-OFETs shown in FIG. 2E shown in linear scale, according to an embodiment of the subject invention.
Figure 10B:
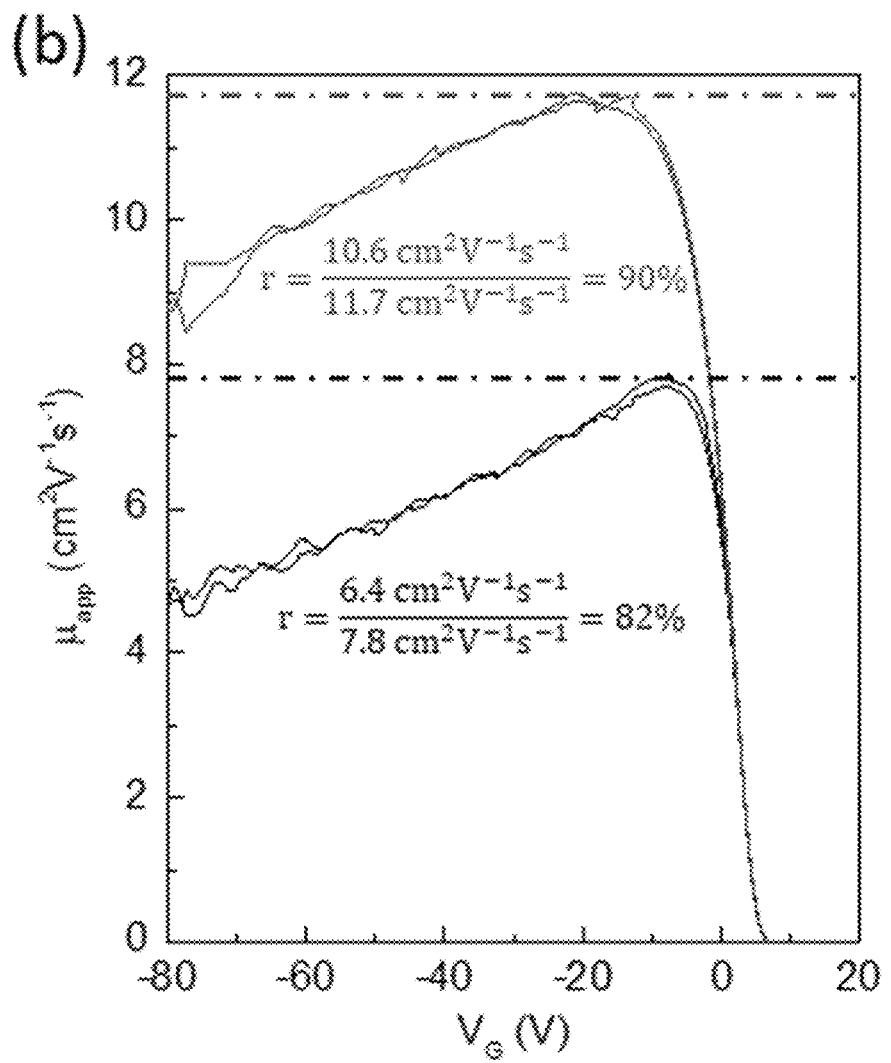
FIG. 10B shows the apparent mobility versus $V_G$ plots of 1L-OFETs, as calculated from FIG. 2E, according to an embodiment of the subject invention.
Figure 10C:
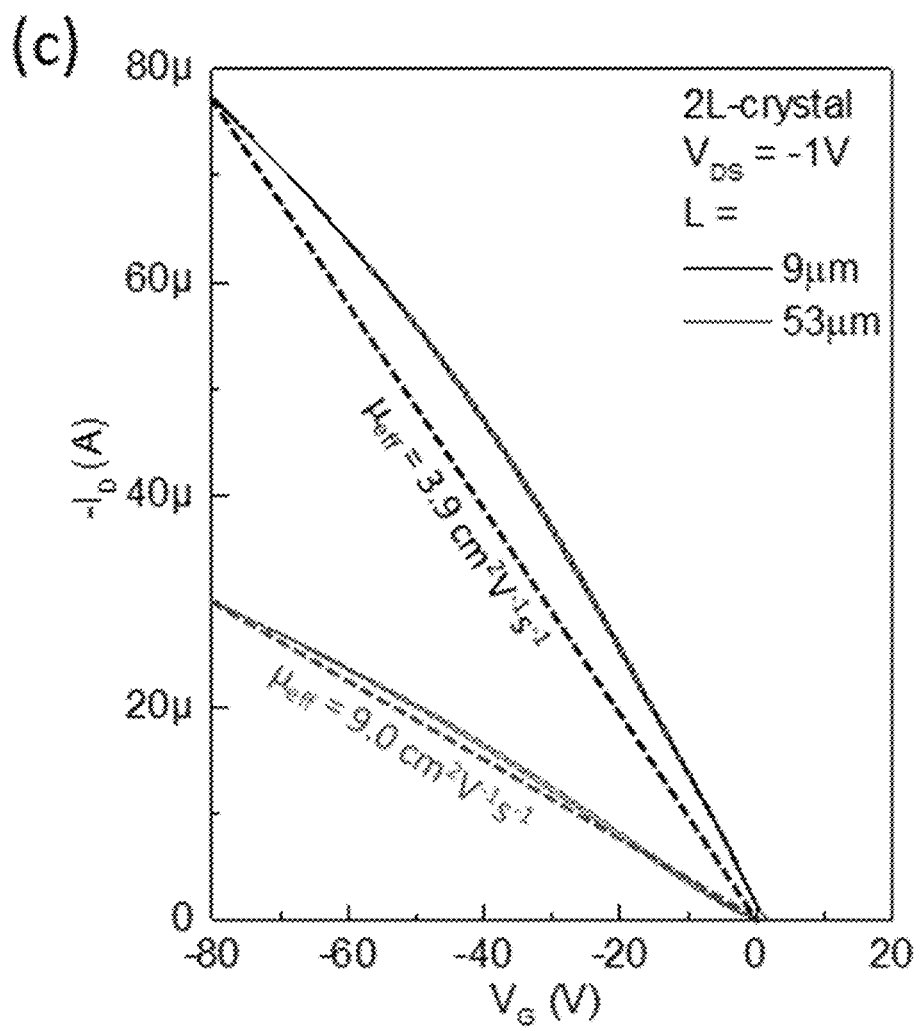
FIG. 10C shows transfer curves of 2L-OFETs shown in FIG. 2F shown in linear scale, according to an embodiment of the subject invention.
Figure 10D:
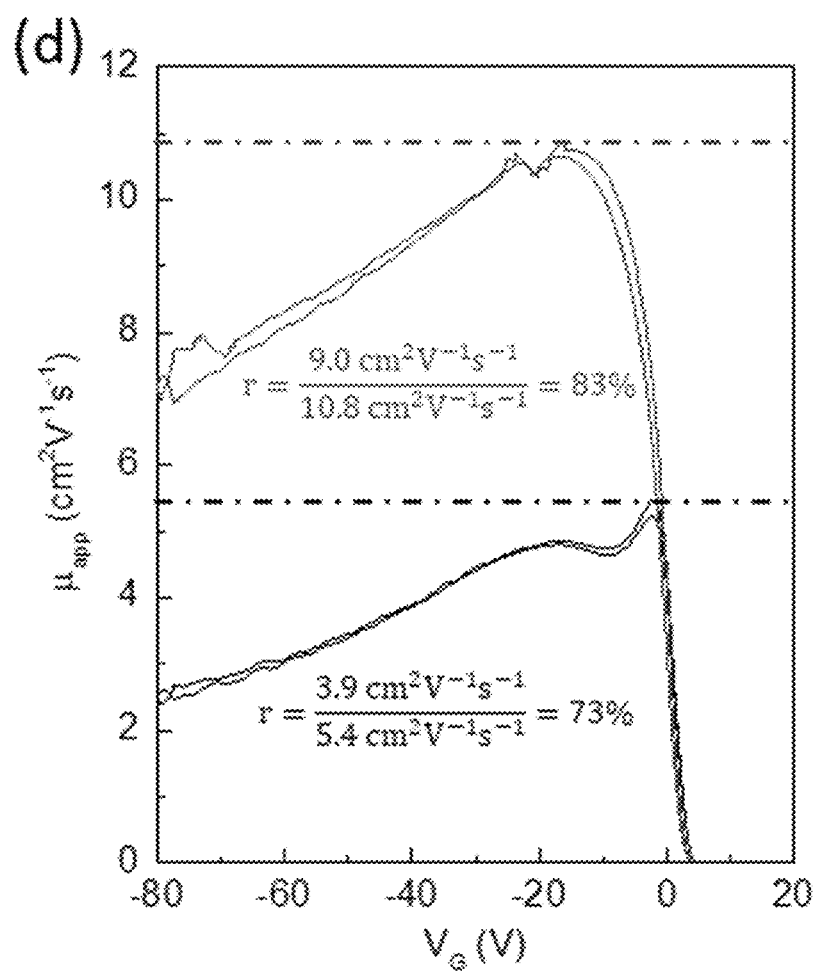
FIG. 10D shows apparent mobility versus $V_G$ plots of 2L-OFETs, as calculated from FIG. 2F, according to an embodiment of the subject invention.

With the transferred Au electrodes, TLM measurements within single crystalline domains of 1L as shown in FIGS. 2A and 2B, and 2L as shown in FIGS. 2C and 2D are conducted for evaluations of the contact resistance. All devices are configured so that the lateral charge transport occurs along the a-axis (the high-mobility axis) of the crystals. The dark state under cross-polarized optical microscopy (CPOM) is used to optically determine the a-axis of the crystal, as illustrated in FIG. 9. Prior to the electrical measurements, the tested regions of the OSC are isolated from the excess regions to avoid errors in the TLM fitting due to the drain-source fringe current and the gate-source leakage current.

The devices exhibit good transfer characteristics and high reliability factors ($r_{lin}$ factor) for both 1L ($r_{lin}$=82-90%) and 2L ($r_{lin}$=73-83%) OFETs, as shown in FIGS. 10A-10D. The reason for the $r_{lin}$ to be smaller than 100% is likely due to the mild decay of the apparent mobility at a higher $V_G$ bias, where scattering effects of the high-density accumulated carriers (given the $t_{ch}$ is only 1.6 nm) involve.

Figure 2E:
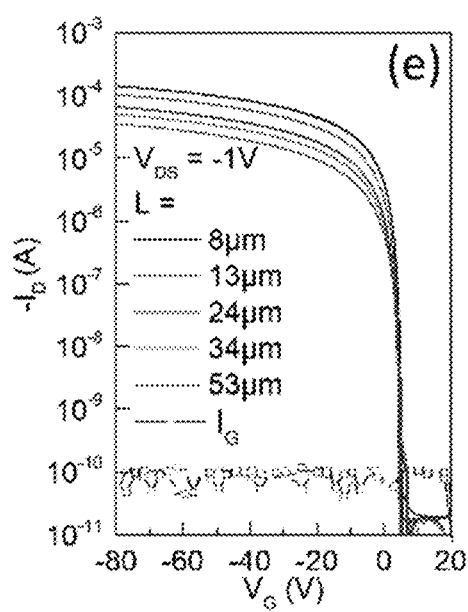
FIG. 2E shows forward and backward transfer curves measured in the linear regime of operation and plotted on a semi-logarithmic scale of the 1L-devices, according to an embodiment of the subject invention.
Figure 2F:
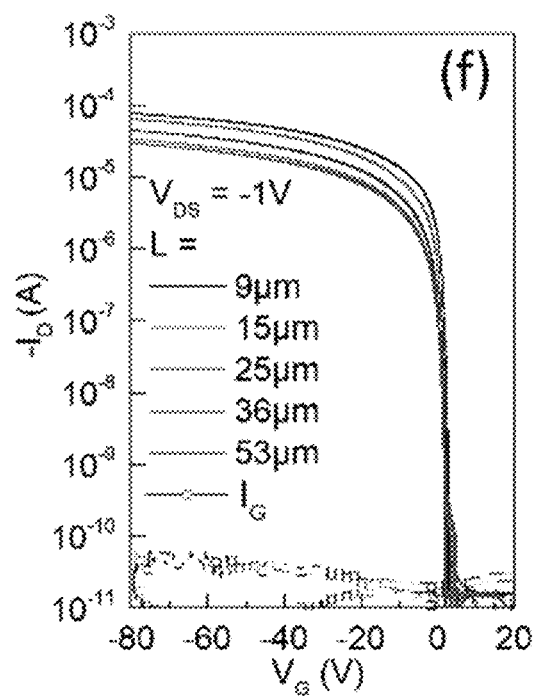
FIG. 2F shows forward and backward transfer curves measured in the linear regime of operation and plotted on a semi-logarithmic scale of the 2L-devices, according to an embodiment of the subject invention.

When the typical transfer properties of the shortest-channel OFETs for the 1L (8 μm channel length) and 2L-devices (9 μm channel length) in FIGS. 2E and 2F are compared, it is noted from their transfer curves (linear regime at $V_{DS}=-1$ V with forward and backward scan) that the subthreshold swings are 370 mV/dec and 366 mV/dec for 1L and 2L-devices, respectively. Moreover, the on/off ratios are in the order of $10^6$, threshold voltage ($V_{TH}$) is in a range of 2.1 V and 1.2 V, and the hysteresis of the gate bias is in a range of 0.47 V and 0.51 V as shown in FIGS. 2E and 2F. All these performance indicators of the 1L- and 2L-OFETs are quite comparable.

Figure 2G:
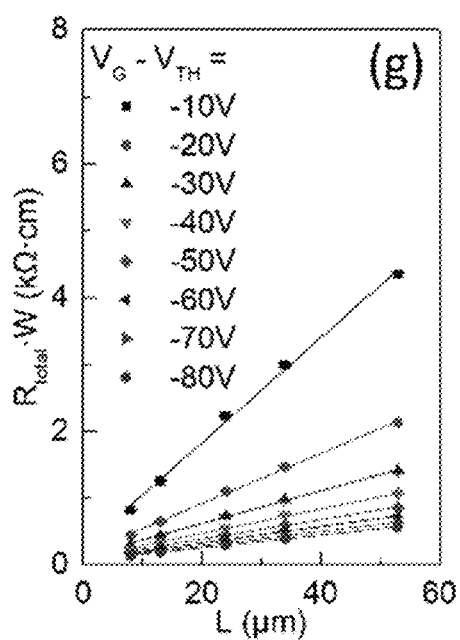
FIG. 2G shows results of total device resistance calculated based on the transmission line method (TLM) and plotted as a function of the channel length of the transistors for various gate overdrive voltages ($V_G$–$V_{TH}$) for the 1L-devices, according to an embodiment of the subject invention.
Figure 2H:
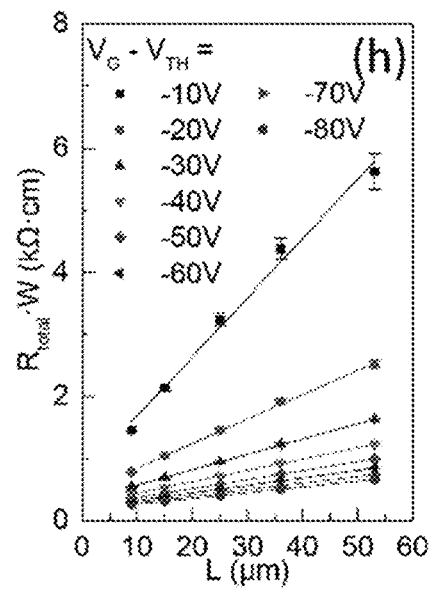
FIG. 2H shows total device resistance calculated based on the transmission line method (TLM) and plotted as a function of the channel length of the transistors for various gate overdrive voltages ($V_G$–$V_{TH}$) for the 2L-devices, according to an embodiment of the subject invention.
Figure 2I:
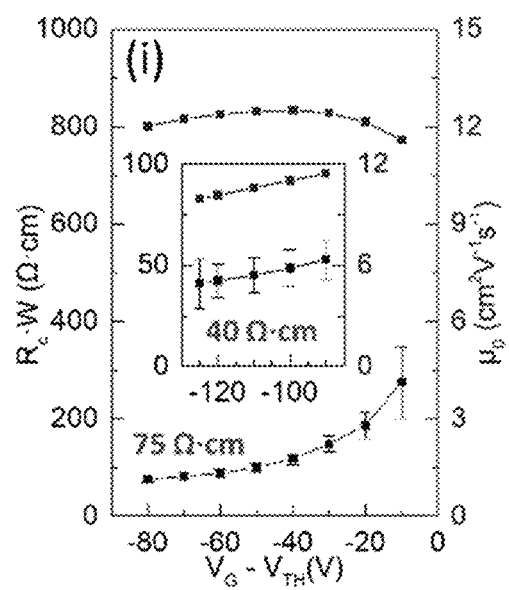
FIG. 2I shows calculated contact resistance (black squares) and intrinsic mobility (blue squares) at various gate overdrive voltages ($V_G$–$V_{TH}$) for the 1L-devices, according to an embodiment of the subject invention.
Figure 2J:
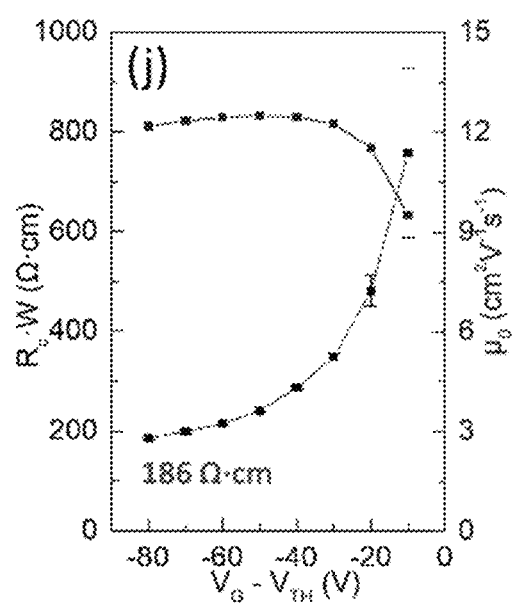
FIG. 2J shows calculated contact resistance (black squares) and intrinsic mobility (blue squares) at various gate overdrive voltages ($V_G$–$V_{TH}$) for the 2L-devices, according to an embodiment of the subject invention.

The $R_{tot} \cdot W$ as a function of the channel length calculated at particular $V_{ov}$ for the 1L- and 2L-OFETs are shown in FIGS. 2G and 2H, respectively. The contact resistance ($R_c \cdot W$) and the intrinsic mobility ($\mu_0$) can be extracted from the linear fittings by Eq. (1) shown in FIGS. 2G and 2H, and be summarized in FIGS. 2I and 2J. The $R^2$ values for all the linear fits are greater than 0.99, and the error bars of $R_c$ are calculated from the standard errors of the regression slopes. For the 1L-devices, the $R_c \cdot W$ is determined to be about 275 Ω·cm at $V_{ov}=-10$ V, about 75 Ω·cm at $V_{ov}=-80$ V, and about 40 Ω·cm at $V_{ov}=-125$ V, which are values lower than these of conventional staggered OFETs previously reported.

On the other hand, the $\mu_0$ shows no strong dependence on the gate bias and is essentially stable at 12.5 $cm^2/V^{-1}s^{-1}$. For the 2L-devices, the $R_c \cdot W$ at $V_{ov}=-80$ V is determined to be about 186 Ω·cm, which is about 2.5 times of the value of the 1L-devices, suggesting that the second ML induces an additional access resistance ($R_a$) compared with the 1L-devices.

However, the intrinsic mobility of the 2L-devices (12.4 $cm^2/V^{-1}s^{-1}$) is determined to be similar to that of the 1L-devices. The 1L semiconductor and transferred electrodes specifically address the two above-mentioned major challenges of staggered OFETs for reaching low contact resistance, that is, the access resistance across the OSC layer ($R_a$) and interfacial resistance across the M/OSC interface ($R_{int}$). The 1L semiconductor and transferred electrodes offer significant improvement at the charge injection.

Figure 3A:
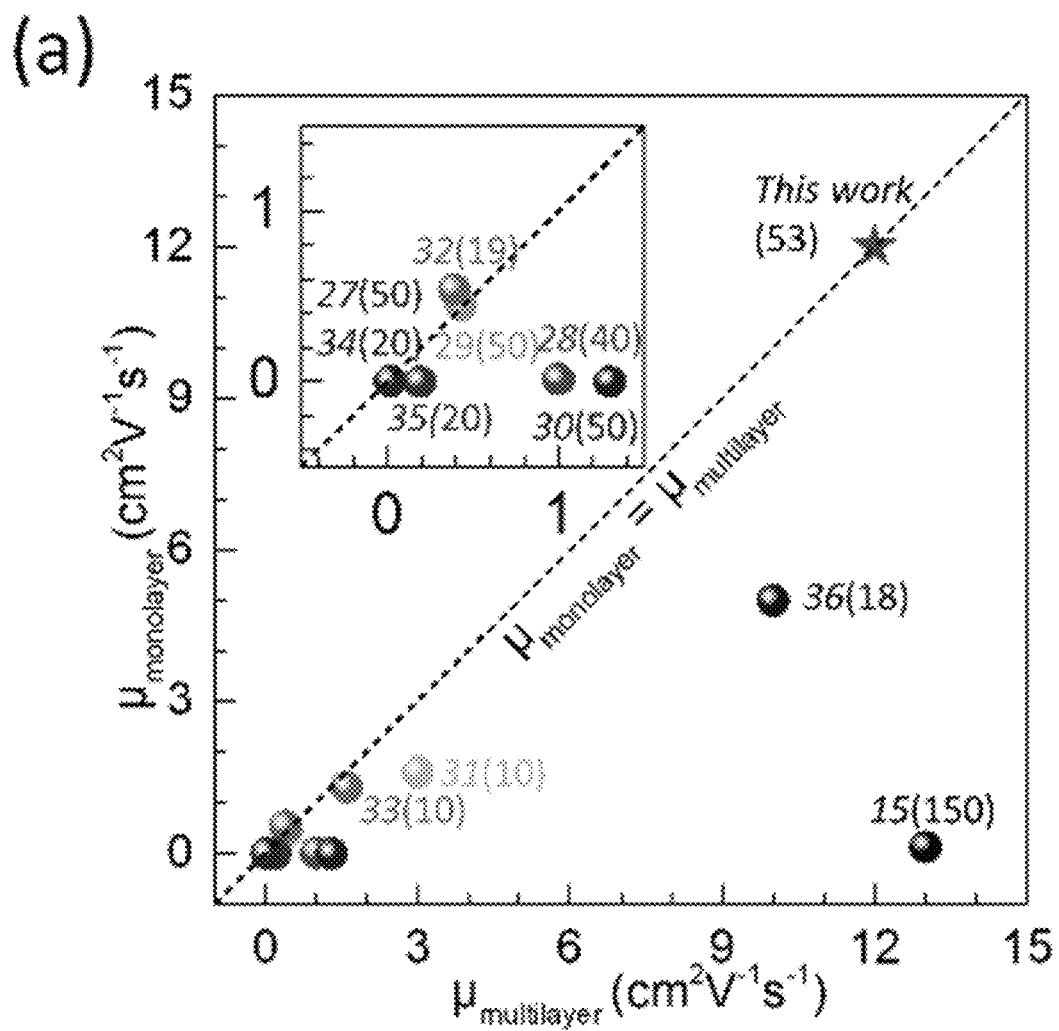
FIG. 3A shows a plot diagram of the apparent mobility based on the monolayer and multilayer of the same OSC materials, according to an embodiment of the subject invention.

As shown in FIG. 3A, the mobilities of the monolayer and multilayer OFETs (ML number ≥2) are comparable with the same fabrication method and active layer materials. The trend shows that the devices with thicker active layers generally outperform the monolayer-based ones. However, the almost identical mobility values of the 1L and 2L-devices imply that the carrier transport in the monolayer $C_{10}$-DNTT is not affected by trap states or defects within the single-crystalline domains, confirming the benefits of using high-quality monolayer OSC crystals in staggered OFETs.

Figure 3B:
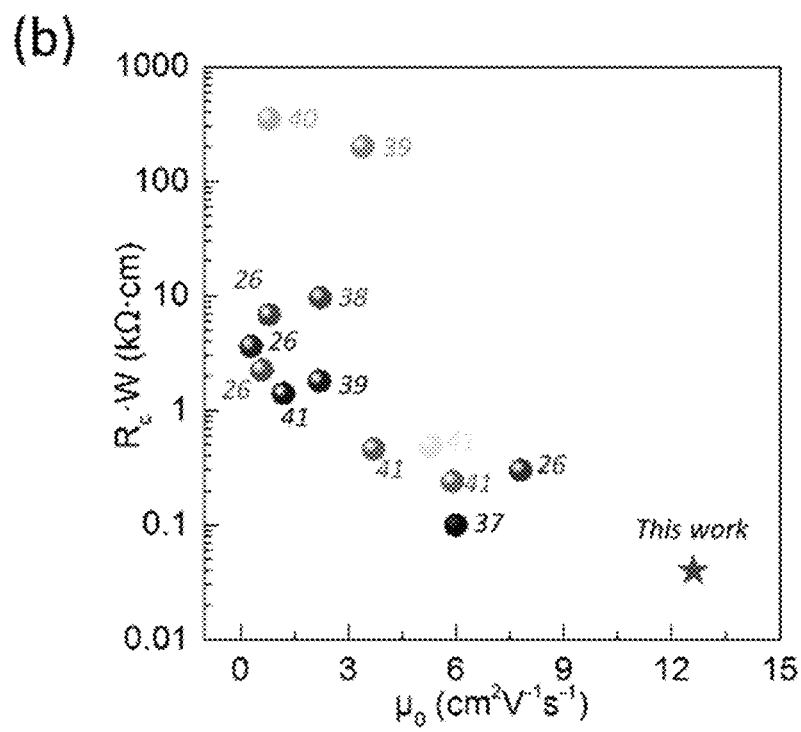
FIG. 3B shows a plot diagram of the $R_c \cdot W$ and $\mu_0$ values with only metal and organic semiconductor in contact, according to an embodiment of the subject invention.

A high $\mu_0$ is also essential in suppressing the $R_c$ of OFETs as summarized by the negative correlation between $\mu_0$ and $R_c$ in FIG. 3B. The outstanding $\mu_0$ and $R_c$ values of the 1L-OFET devices with transferred electrodes validate the advantages of the fabrication technique for high-performance short-channel OFETs.

Figures 11A, 11B, 11C:
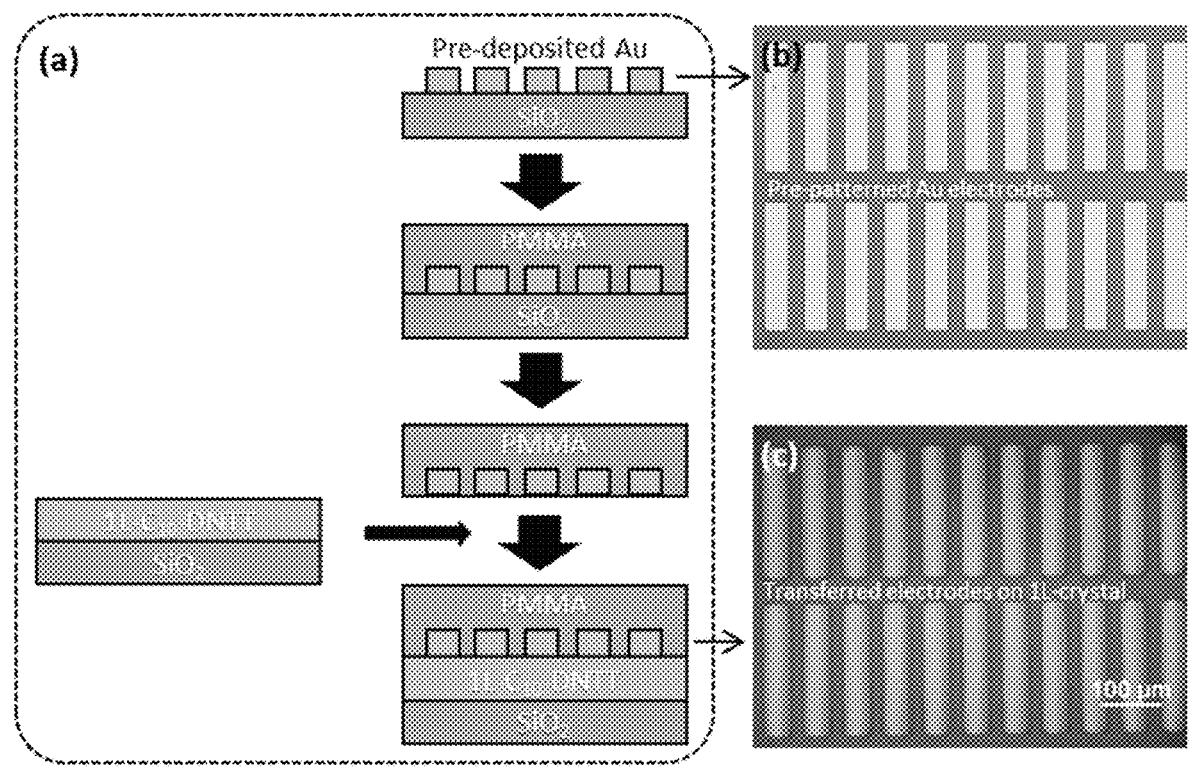
FIG. 11A shows a schematic representation of processes of the transfer process, according to an embodiment of the subject invention.
FIG. 11B shows patterned Au electrodes on $OTS/SiO_2$ substrate before transfer, according to an embodiment of the subject invention.
FIG. 11C shows patterned Au electrodes on 1L-crystal after transfer, according to an embodiment of the subject invention.
Figure 11D:
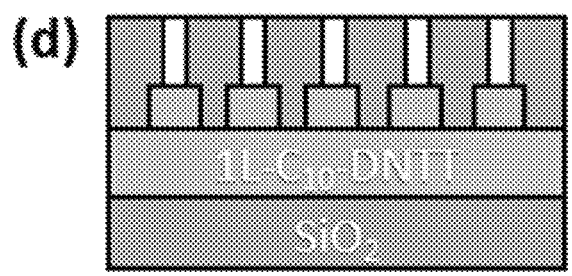
FIGS. 11D and 11E show via holes opened at the middle of the Au electrodes by e-beam lithography, in order to make electrical contact, according to an embodiment of the subject invention.
Figure 11E:
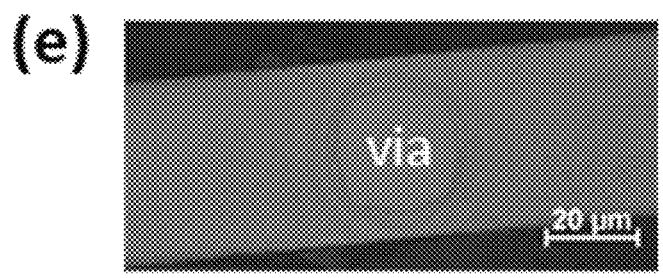
Figure 11F:
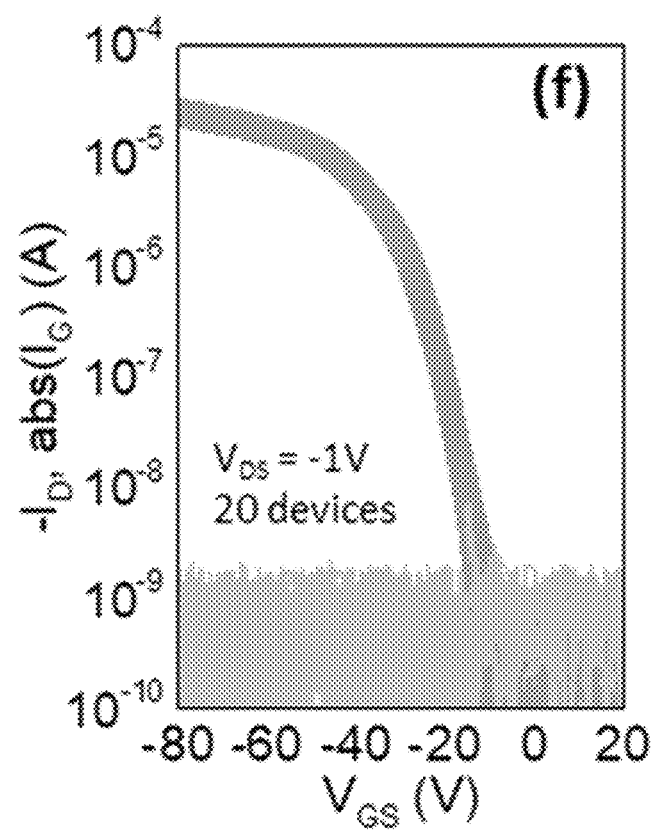
FIG. 11F shows transfer curves of 20 devices shown in FIG. 11C, according to an embodiment of the subject invention.
Figure 12A:
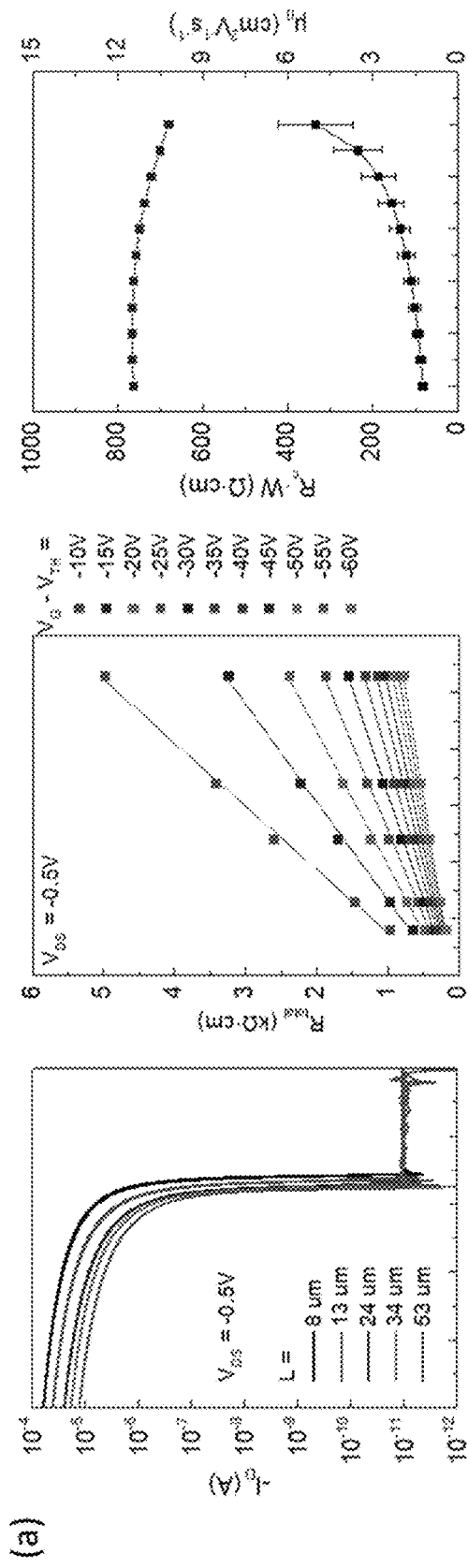
FIGS. 12A-12F show TLM fitting results at $V_{DS}$=−0.5V measured at 300 K, $V_{DS}$=−0.1V measured at 300 K, $V_{DS}$=−0.05V measured at 300 K, $V_{DS}$=−0.01V measured at 300 K, $V_{DS}$=−0.005V measured at 300 K, $V_{DS}$=−0.001V measured at 300 K, respectively; the results including (i) transfer curves measured in the linear regime of operation and plotted on a semi-logarithmic scale, (ii) total device resistance calculated using the transmission line method (TLM) and plotted as a function of the channel length of the transistors for various gate overdrive voltages ($V_G-V_{TH}$), and (iii) calculated contact resistance (black squares) and intrinsic mobility (blue squares) at various gate overdrive voltages ($V_G-V_{TH}$), the error bars standing for absolute fitting errors, according to an embodiment of the subject invention.
Figure 12B:
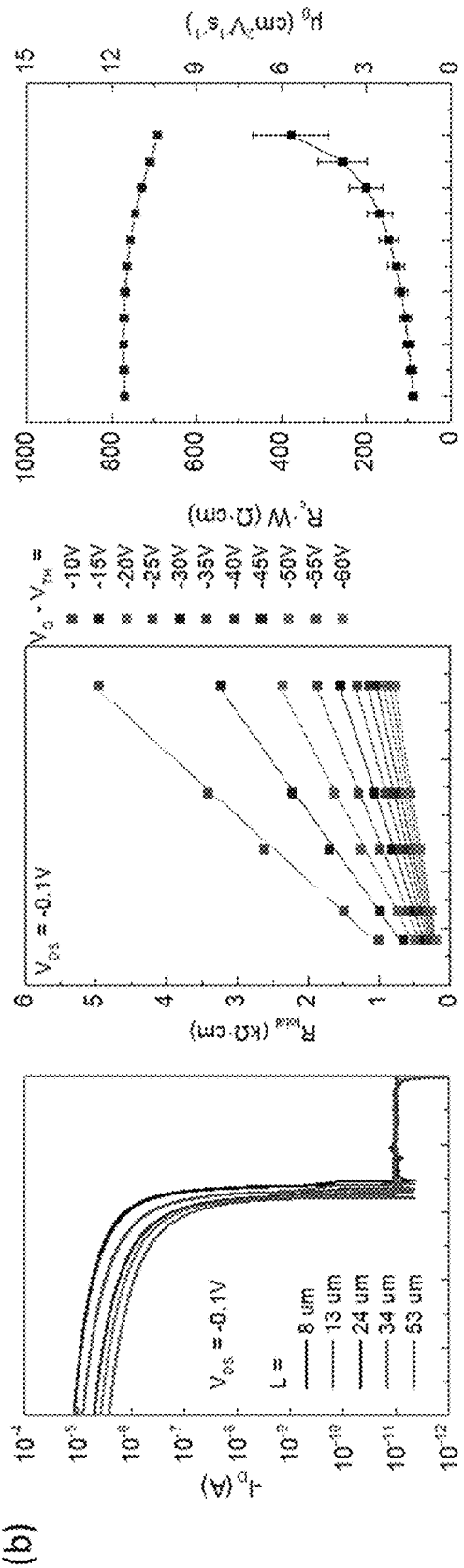
Figure 12C:
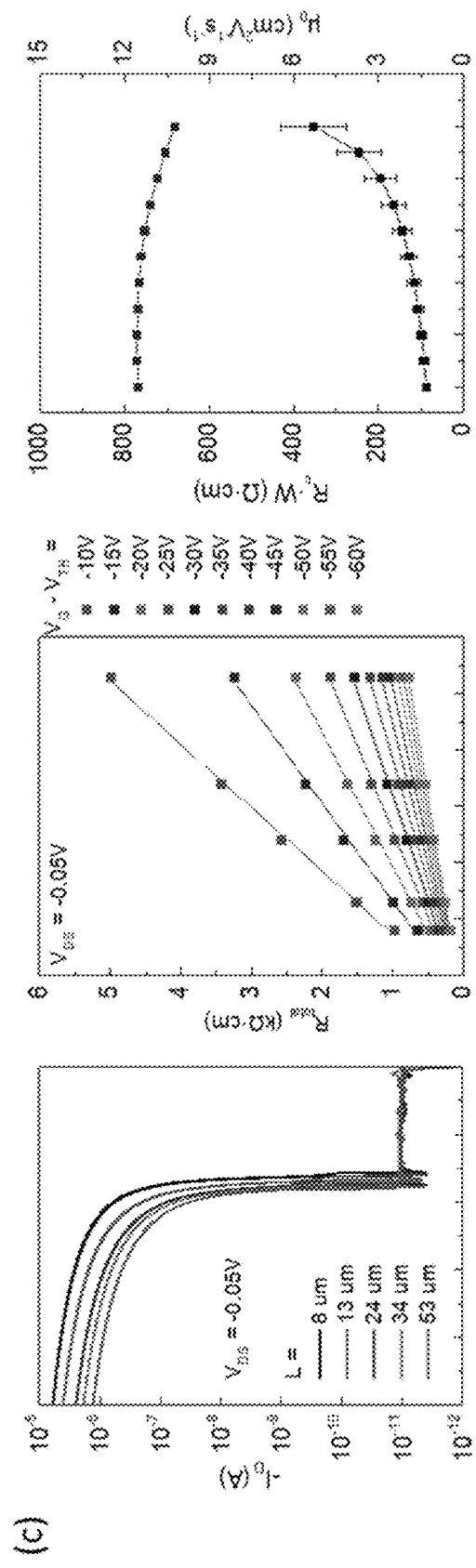
Figure 12D:
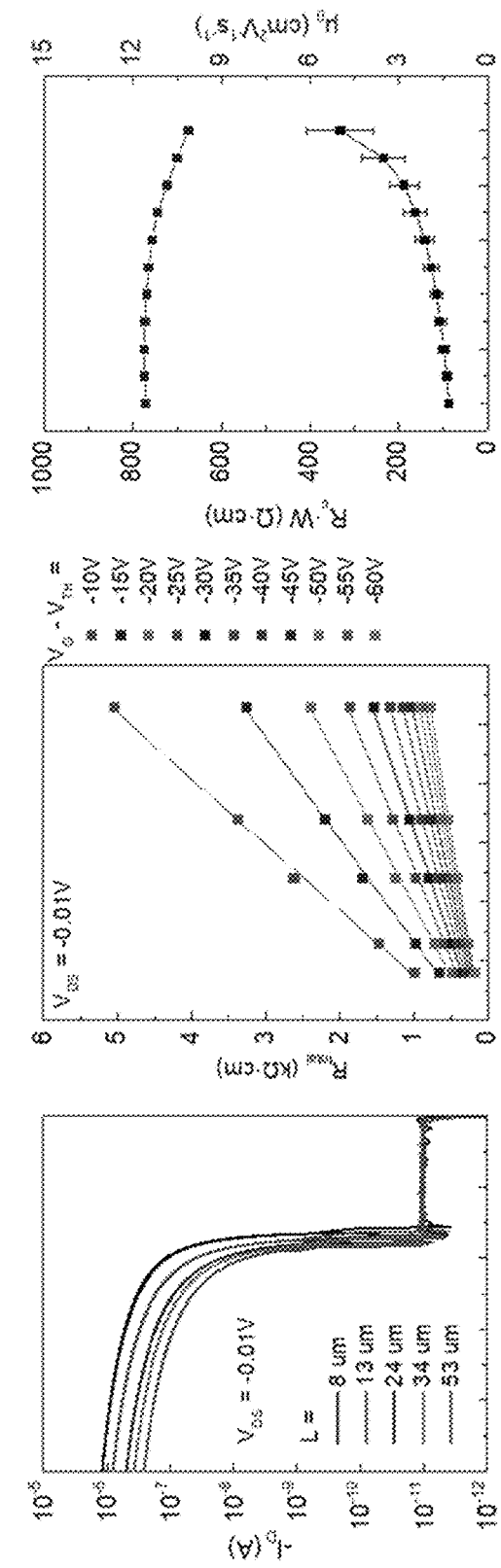
Figure 12E:
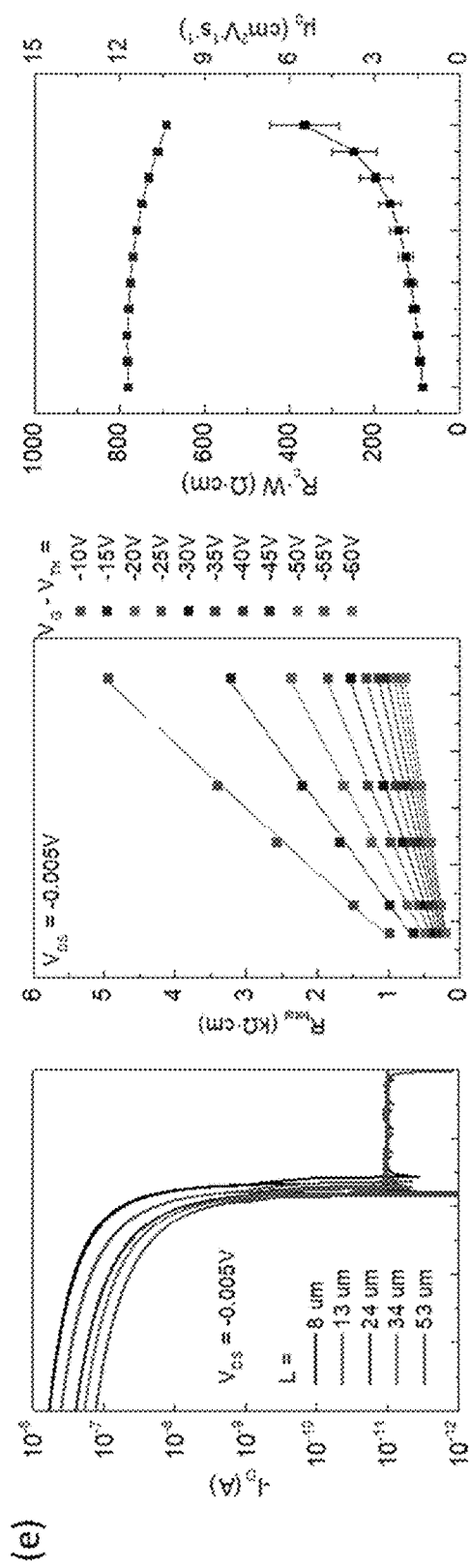
Figure 12F:
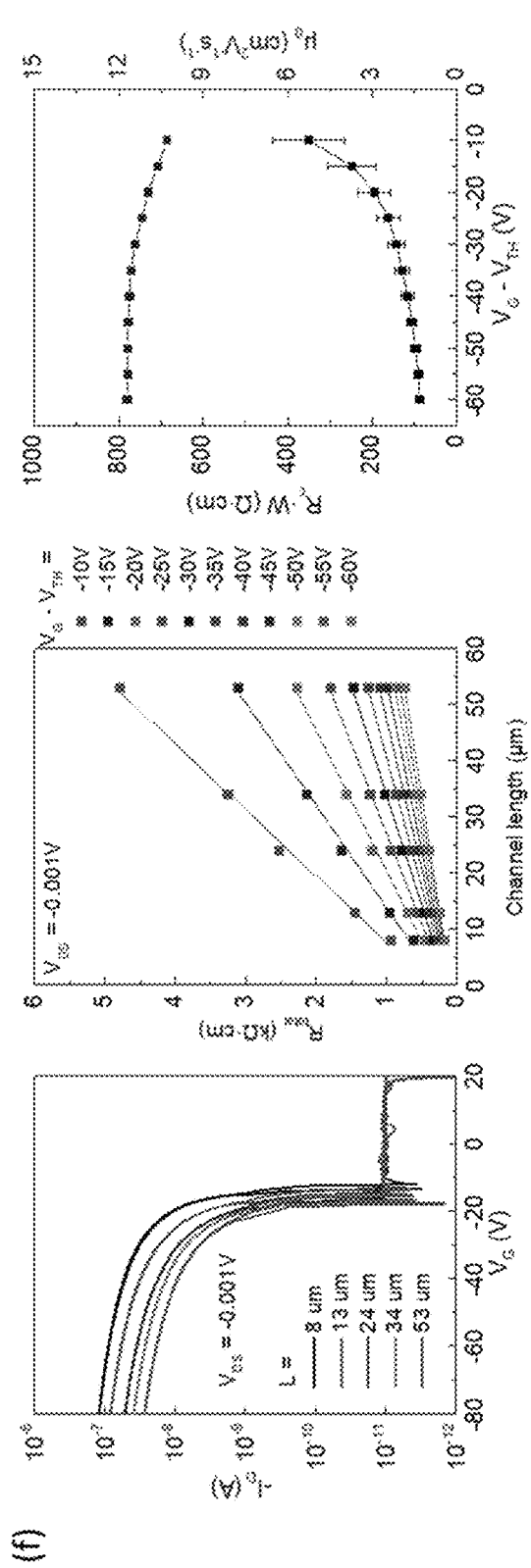
Figure 13A:
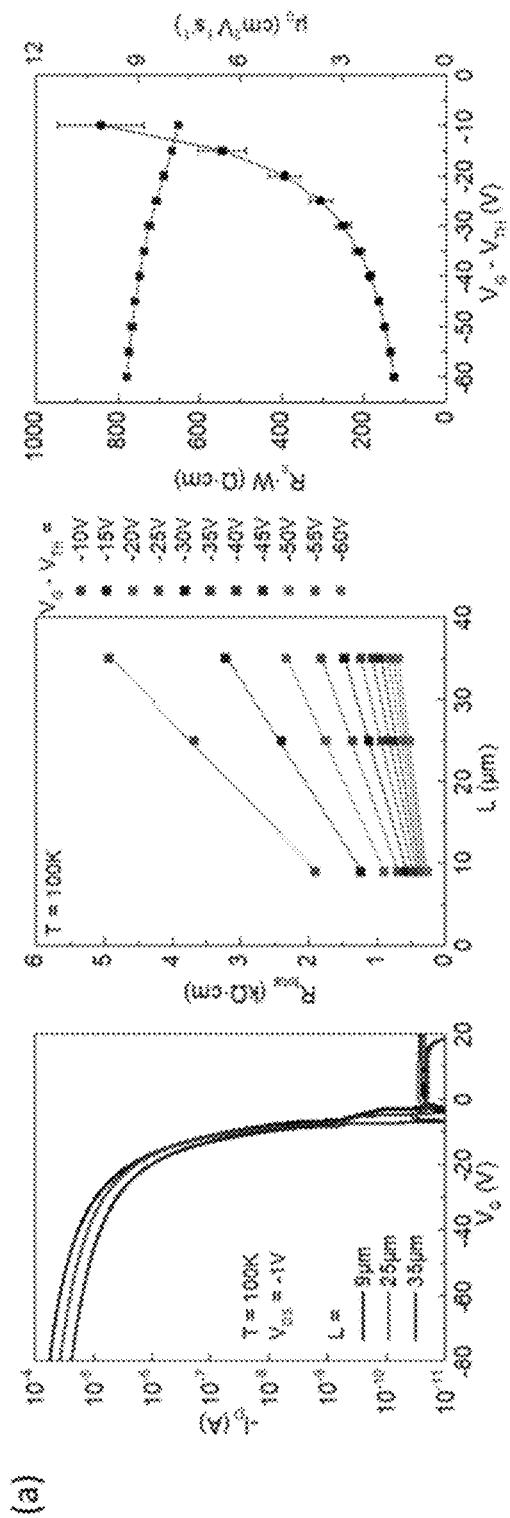
FIGS. 13A-13G show TLM fitting results at T=100 K measured at VDS=−1 V, at T=140 K measured at VDS=−1 V, at T=180 K measured at VDS=−1 V, at T=220 K measured at VDS=−1 V, at T=260K measured at VDS=−1 V, at T=300 K measured at VDS=−1 V, at T=340 K measured at VDS=−1 V, respectively; the results including: (i) transfer curves measured in the linear regime of operation and plotted on a semi-logarithmic scale, (ii) total device resistance calculated using the transmission line method (TLM) and plotted as a function of the channel length of the transistors for various gate overdrive voltages (VG–VTH), and (iii) calculated contact resistance (black squares) and intrinsic mobility (blue squares) at various gate overdrive voltages (VG–VTH), the error bars standing for absolute fitting errors, according to an embodiment of the subject invention.
Figure 13B:
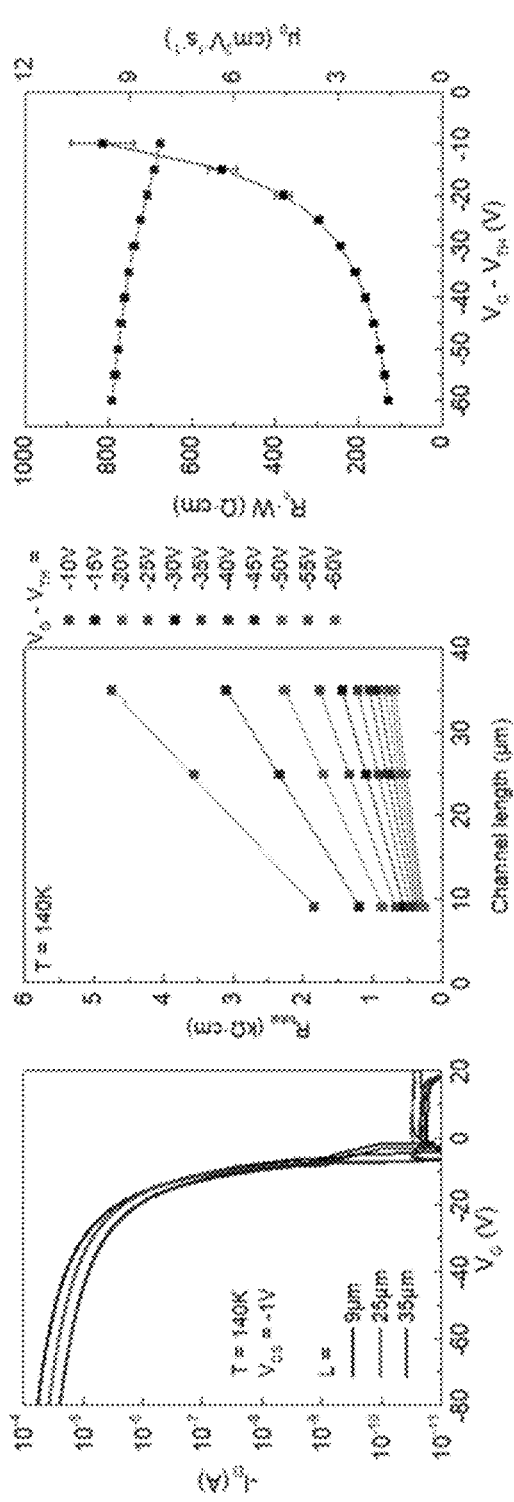
Figure 13C:
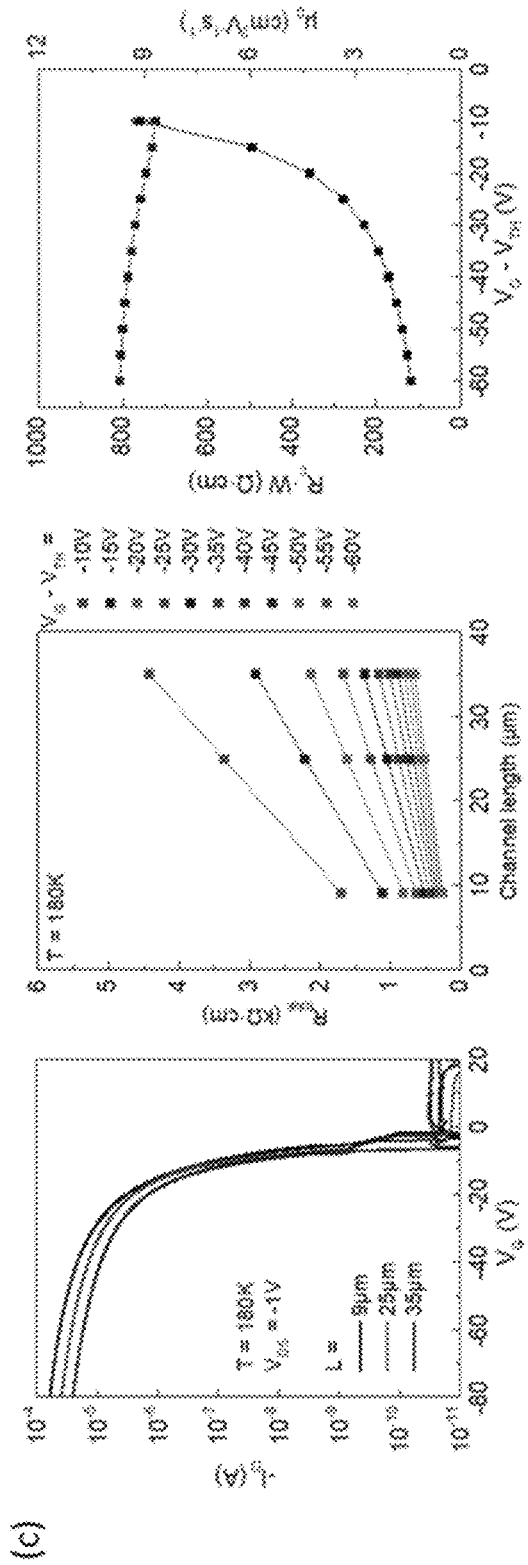
Figure 13D:
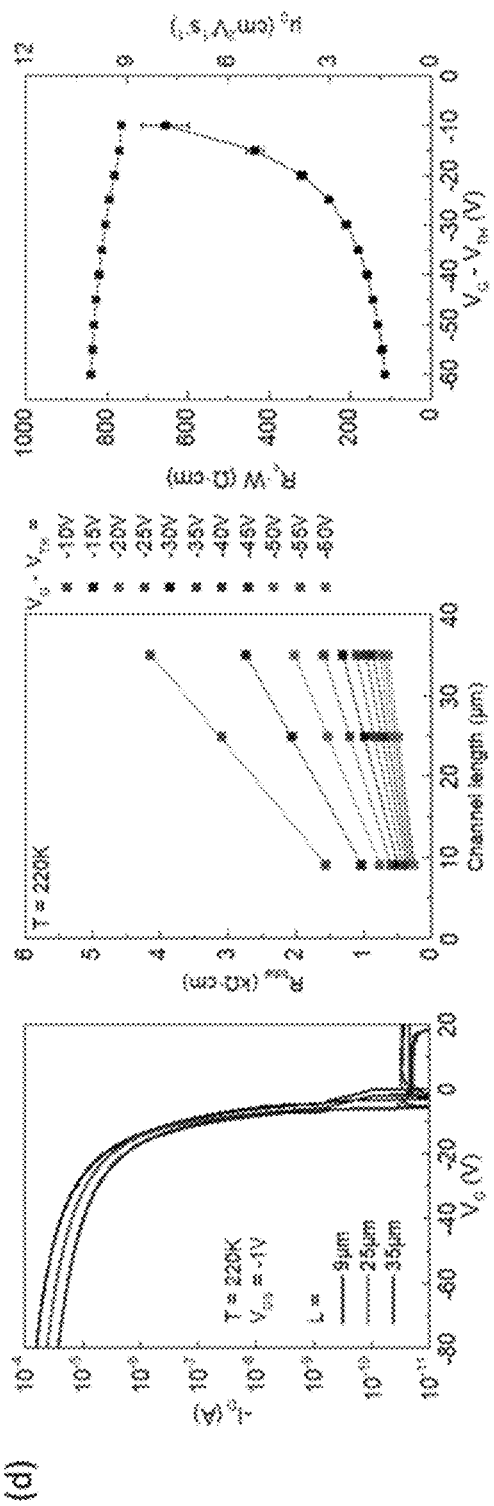
Figure 13E:
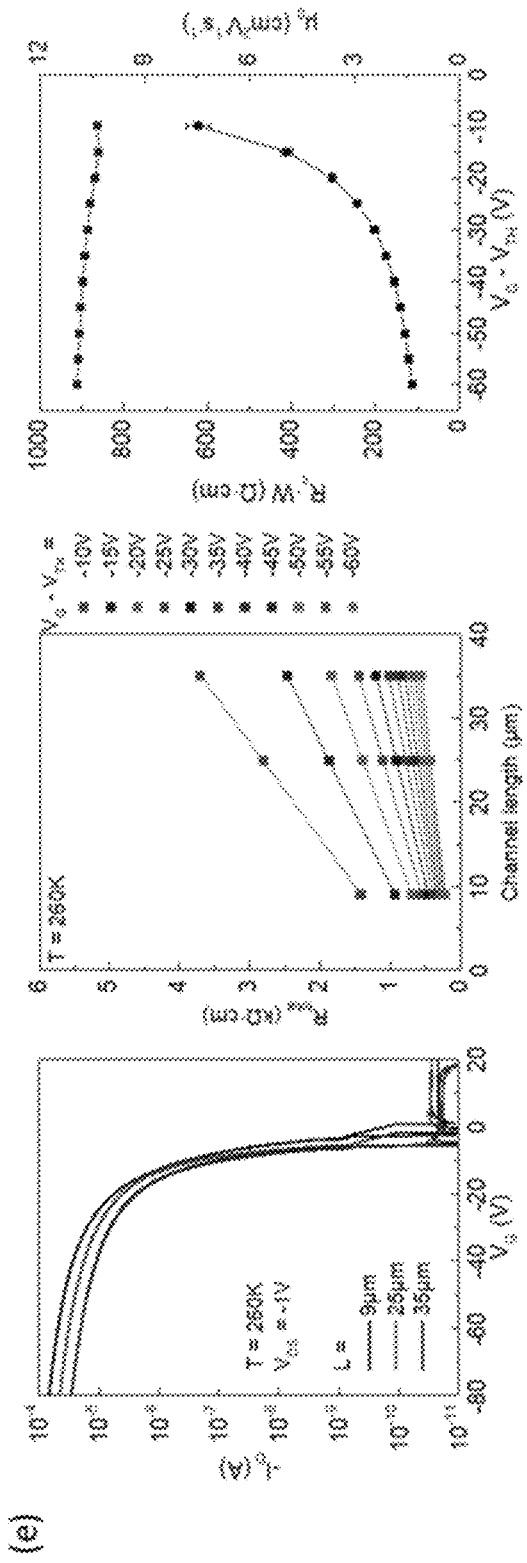
Figure 13F:
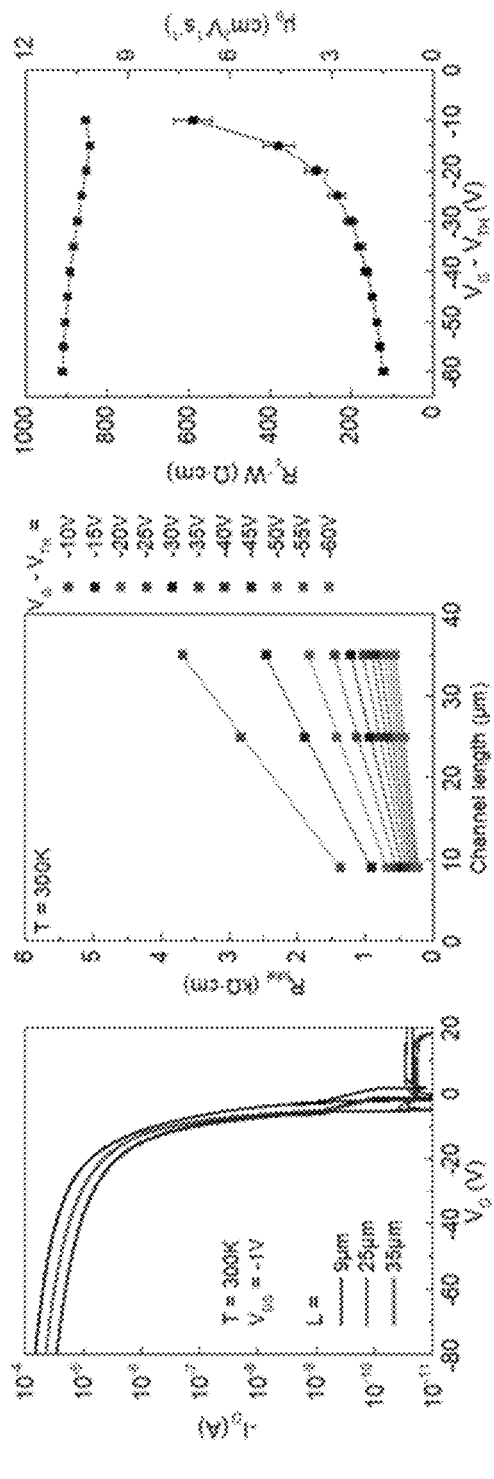
Figure 13G:
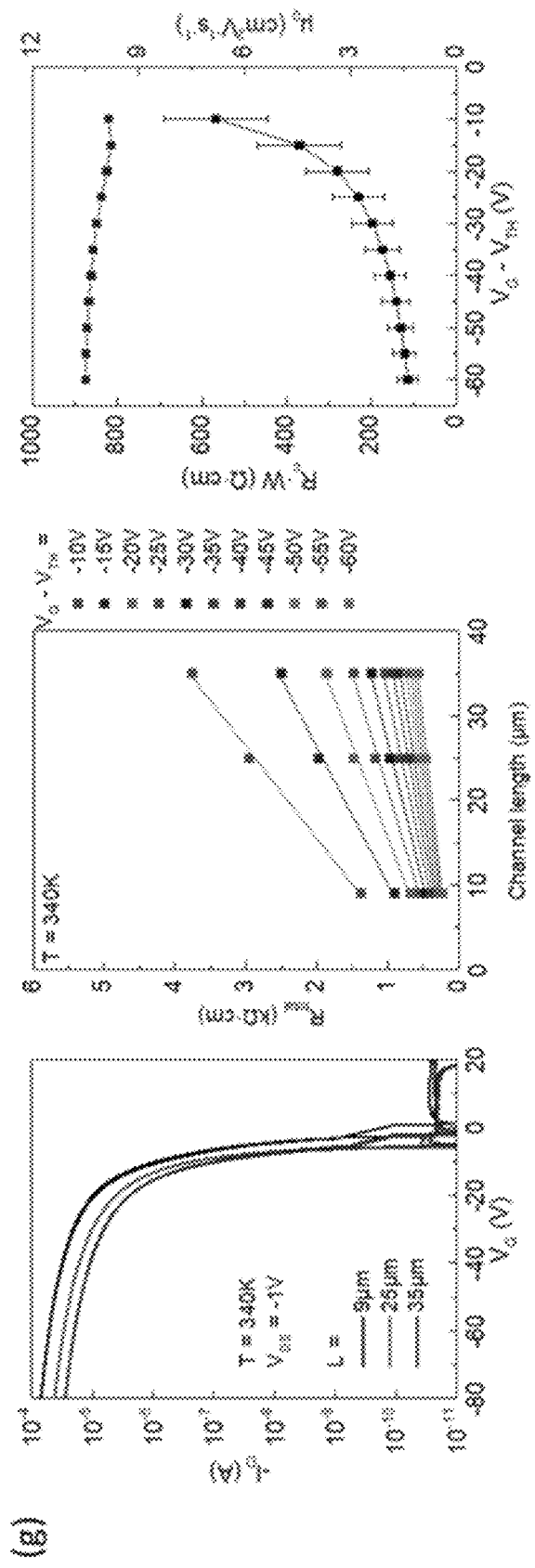

The performance of such transfer technique in a large-area and patterned manner is shown in FIGS. 11A-11F. A significant number of pre-patterned Au electrodes can be mass-transferred onto 1L-crystals by a Polymethyl methacrylate (PMMA) stamp. A plurality of, for example, 20, devices is selected for the tests and uniform electrical performance is found across different devices as shown in FIG. 11F. The observation demonstrates application potential of the transfer electrode technique for practical device construction and connection.

$R_c$ Dependency on $V_{DS}$ and Temperature

In the linear operation regime of FETs, the drain-current shows linear response to the $V_{DS}$. Such linearity is highly desirable in accurate signal processing applications such as small-signal biosensors, backplanes drivers for display, and audio devices. However, the conventional Schottky contact in OFETs limited such linearity, especially in small $V_{DS}$ ranges.

Figure 3C:
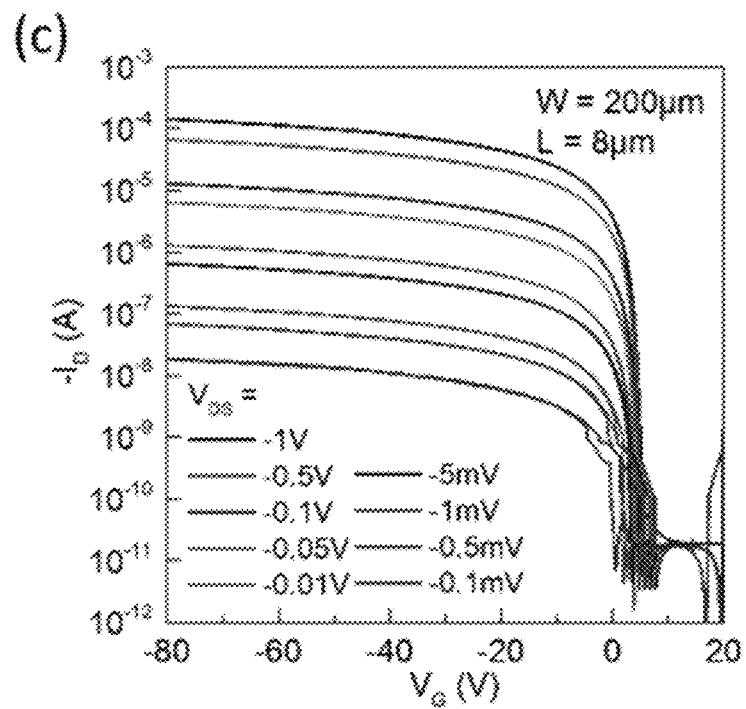
FIG. 3C shows a plot diagram of the forward and backward linear transfer curves of an 1L-OFET with 8-µm channel length at different $V_{DS}$ ranging from −1 V to −0.1 mV, according to an embodiment of the subject invention.
Figure 3D:
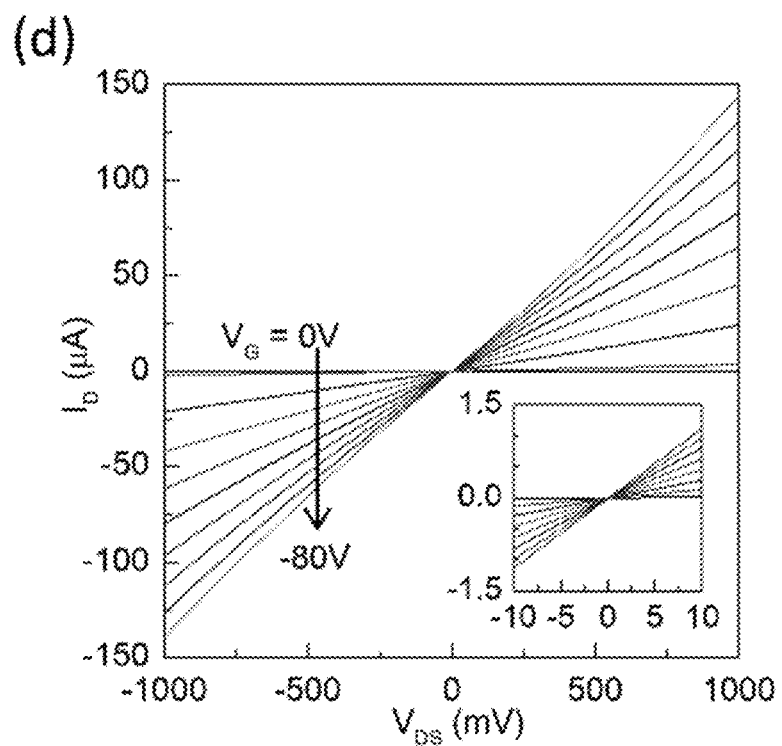
FIG. 3D shows a plot diagram of the apparent linear mobility of the device in FIG. 3C, according to an embodiment of the subject invention.

FIG. 3C shows that the 1L single-crystalline OFET exhibits proper transfer characteristics when the drain-source voltage is in a range from about −1 V to about −0.1 mV. It is noted that even at a small $V_{DS}$ of −0.1 mV, the on/off ratio of the devices can be maintained to be greater than $10^3$. The output behaviors of the 1L-OFET within the $V_{DS}$ range from −1 V to 1 V and −10 mV to 10 mV are shown in FIG. 3D and its inset.

Figure 3E:
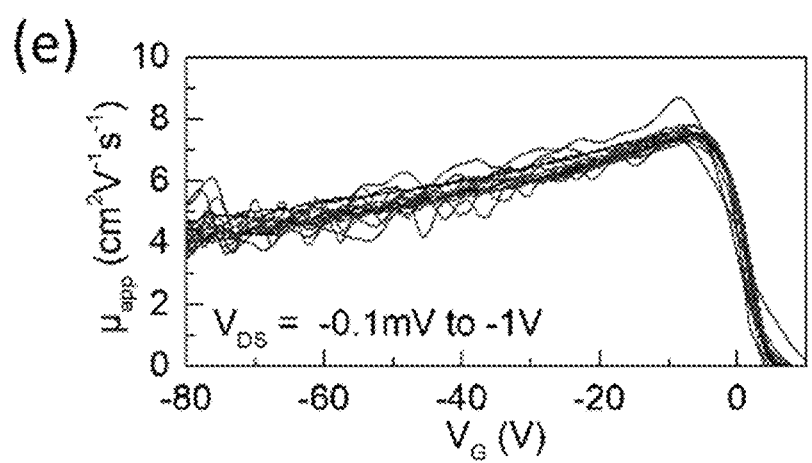
FIG. 3E shows a plot diagram of the output curves scanning from $V_{DS}$=1 V to $V_{DS}$=−1 V of the device in FIG. 3C, according to an embodiment of the subject invention.

The highly linear and symmetric output curves indicate that the resistor behavior is dominant at the contact and the channel. In FIG. 3E, the apparent linear mobility does not show an obvious dependence on the drain-source voltage. Such a linear property at small $V_{DS}$ can be applied to a highly linear sensor or circuit driver, where small voltage fluctuations in $V_{DS}$ may lead to corresponding change in the device.

Thermionic emission and field emission are the two major mechanisms for charge injection across a metal-semiconductor interface and lead to Schottky contacts and Ohmic contacts, respectively. In the scenario of thermionic emission, increasing $V_{DS}$ can induce stronger band bending and lower the Schottky barrier. Hence, it results in apparent saturation mobility at large $V_{DS}$ higher than the apparent linear mobility at small $V_{DS}$.

Similarly, when the temperature goes up, the thermionic emission over the barrier may also be enhanced and lead to a negative correlation between the $R_c$ and T. Thus, the 1L-OFETs show excellent performance in low $R_c$ and high $\mu_0$. For evaluating the physical limits of the transferred electrodes in the monolayer OFET applications, the TLM measurements of the 1L-devices are conducted with $V_{DS}$ ranging from −1 mV to −1 V and with temperature ranging from about 340 K to about 100 K.

Figure 3F:
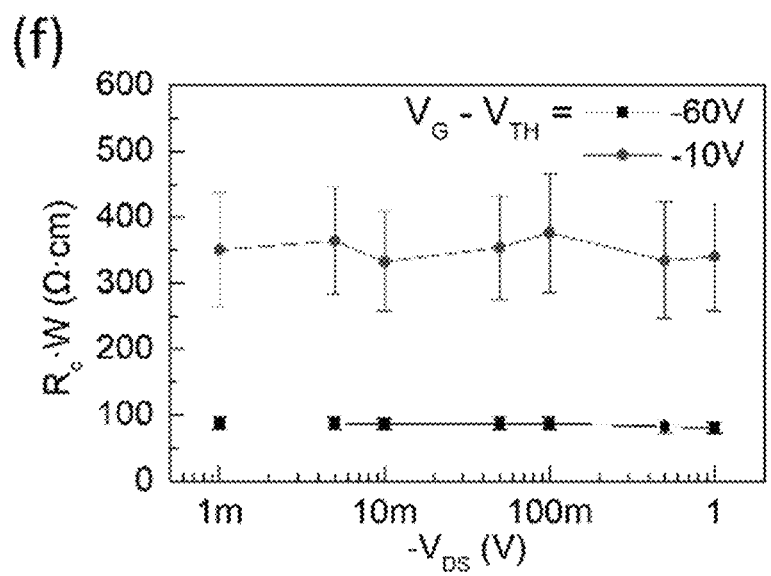
FIG. 3F shows a plot diagram of the fitted intrinsic mobility against $V_{DS}$ at $V_{ov}$=−60 V, according to an embodiment of the subject invention.
Figure 3G:
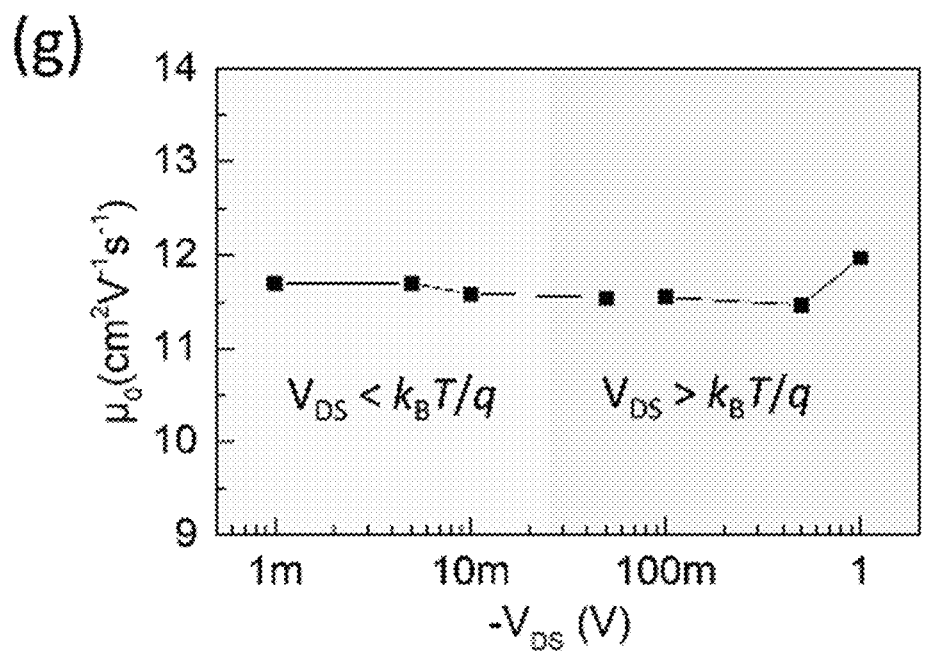
FIG. 3G shows a plot diagram of the contact resistance against $V_{DS}$ at $V_{ov}$=−60 V and $V_{ov}$=−10 V, according to an embodiment of the subject invention.
Figure 14A:
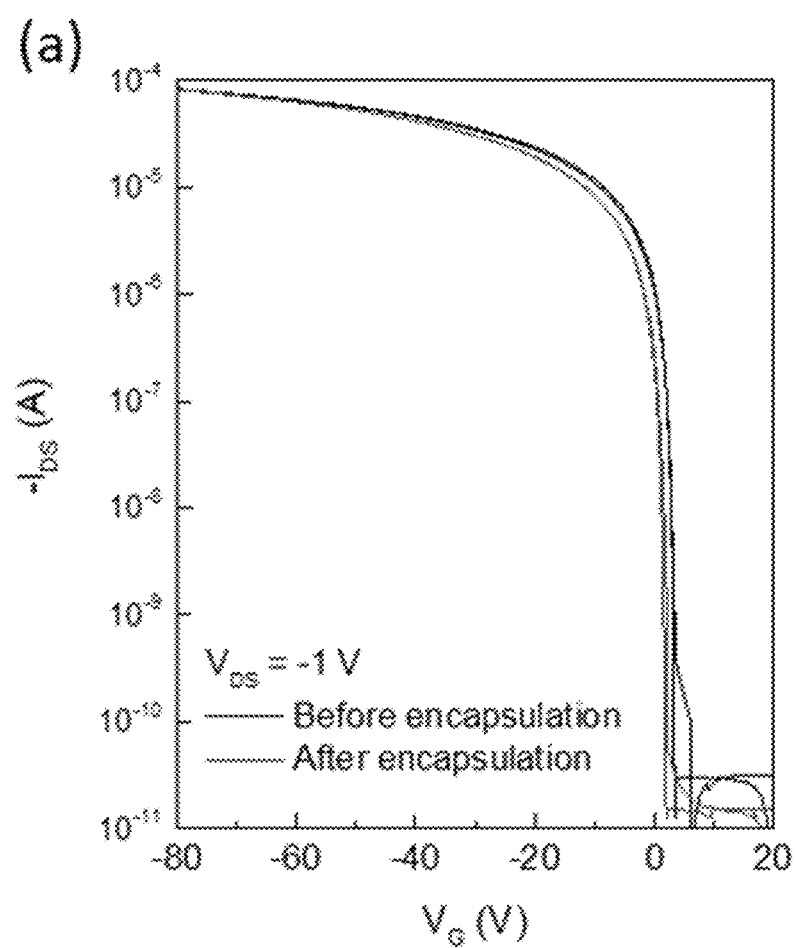
FIG. 14A shows transfer curves measured in the linear regime of operation and plotted on a semi-logarithmic scale, according to an embodiment of the subject invention.
Figure 14B:
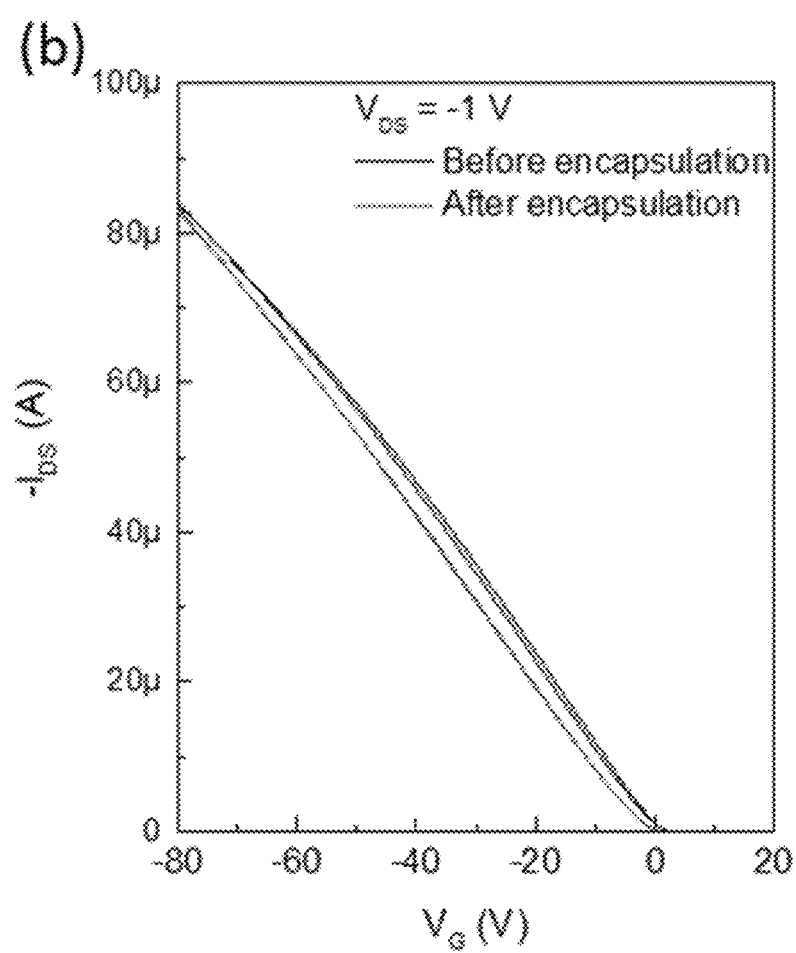
FIG. 14B shows transfer curves measured in the linear regime of operation and plotted on a linear scale, according to an embodiment of the subject invention.

FIGS. 12A-12F show the $V_{DS}$-dependent TLM results with the summarized data and fittings. The intrinsic mobility $\mu_0$ shows no change with $V_{DS}$ below or above the thermal voltage ($k_BT/q$), as illustrated in FIG. 3F, indicating that the diode effect at the source contact is negligible up to $V_{DS}$ around 1 V. The calculated $R_c$ values at two different overdrive voltages, $V_{ov}$=−60 V and $V_{ov}$=−10 V, are plotted in FIG. 3G against different $V_{DS}$ ranging from −1 mV to −1 V. It is found that the contact resistance has no dependency on applied $V_{DS}$ at both $V_{ov}$ values. On the other hand, the temperature-dependent TLM results obtained at temperatures between 100 K and 340 K are shown in FIGS. 13A-13G. The temperature-dependent tests are conducted in a vacuum cryogenic probe-station instead of nitrogen environment, and a thin layer of Cytop (for example, about 200 nm thick) is employed to encapsulate the complete 1L-devices. The Cytop encapsulation has very minor effects on the mobility and threshold voltage of the 1L-device, as confirmed by FIGS. 14A-14B.

Figure 3H:
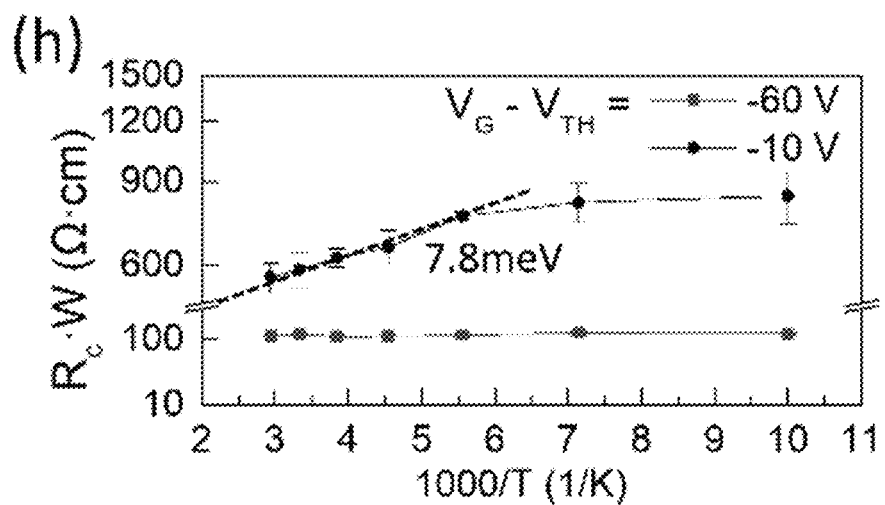
FIG. 3H shows $V_{ov}$=the contact resistance at $V_{DS}$=−1 V against 1000/T at $V_{ov}$=−60 V and $V_{ov}$=−10 V, according to an embodiment of the subject invention.

Referring to the summarized $R_c$ against 1000/T plot in FIG. 3H, a thermally activated charge injection barrier (7.8 meV from an Arrhenius fitting) is found for a case of $V_{ov}$=−10 V. However, no obvious dependency of the $R_c$ on temperature at $V_{ov}$=−60 V is observed. At lower carrier density ($V_{ov}$=−10 V), the Fermi level is relatively far away from the highest occupied molecular orbital (HOMO) level of the semiconductor, and the energy barrier from Au to HOMO of the semiconductor becomes larger. It can be concluded that the carriers need thermal energy to assist the injection. When the carrier density is high at $V_{ov}$=−60 V and the Fermi level is closer to the HOMO level, the $R_c$ becomes merely dependent on temperature. With the carriers injected and extracted mostly by field emission, the devices show an Ohmic-contact behavior. However, it is important to point out that the Ohmic behavior is limited in a small $V_{DS}$ bias condition (for example, −1 V<$V_{DS}$<0 V), where the gradual potential drop approximation and the TLM method are valid. Device may behave differently when a large $V_{DS}$ bias is applied, which will be discussed in the following sections.

High Intrinsic Gain at Saturation Regime

The intrinsic gain ($A_v$) defines the maximum voltage gain that a single OFET can achieve, and it is an important figure of merit for OFETs working in the saturation regime. According to the definition of $A_v = g_m/g_d$, the essential properties for achieving a high $A_v$ include high transconductance ($g_m = \partial I_D/\partial V_G$) and low output conductance ($g_d = \partial I_D/\partial V_{DS}$). To fulfill the demands in high density and high speed for organic electronics, short-channel OFETs with high $A_v$ values are required.

Figure 4A:
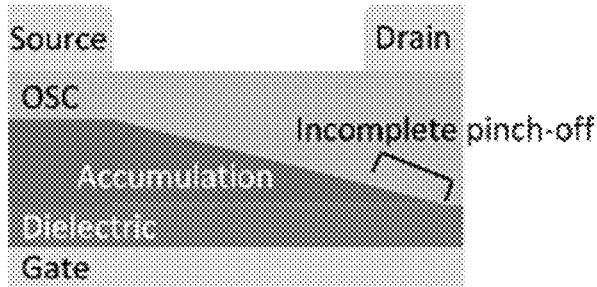
FIG. 4A is a schematic representation of charge accumulation of the short-channel OFETs, according to an embodiment of the subject invention.
Figure 4B:
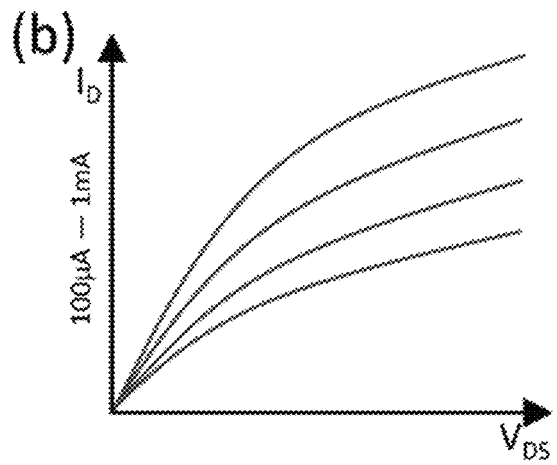
FIG. 4B shows output curves of the short-channel OFETs, according to an embodiment of the subject invention.
Figure 4C:
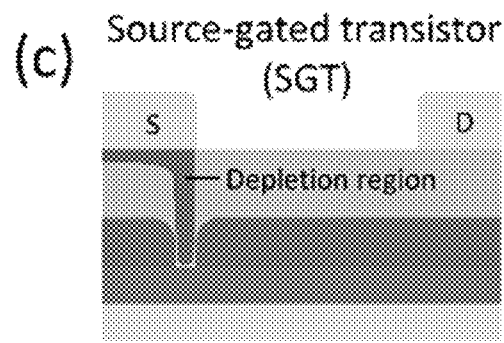
FIG. 4C is a schematic representation of charge accumulation of source-gated transistors, according to an embodiment of the subject invention.
Figure 4D:
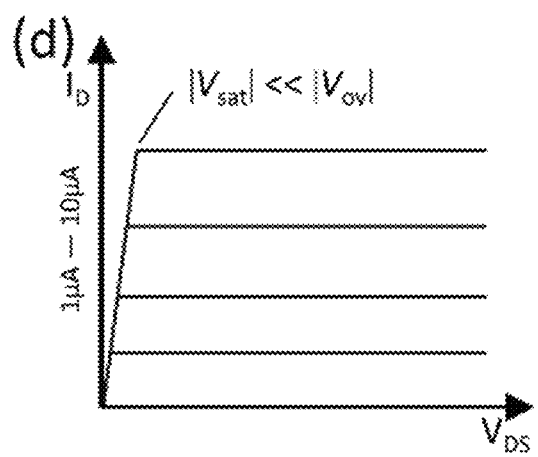
FIG. 4D shows output curves of source-gated transistors, according to an embodiment of the subject invention.
Figure 4E:
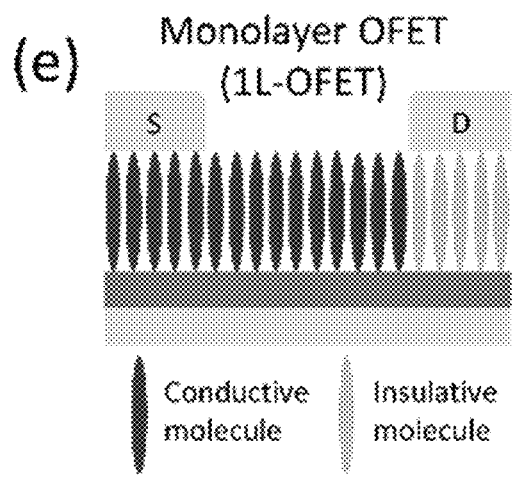
FIG. 4E is a schematic representation of charge accumulation of the 1L-OFETs, according to an embodiment of the subject invention.
Figure 4F:
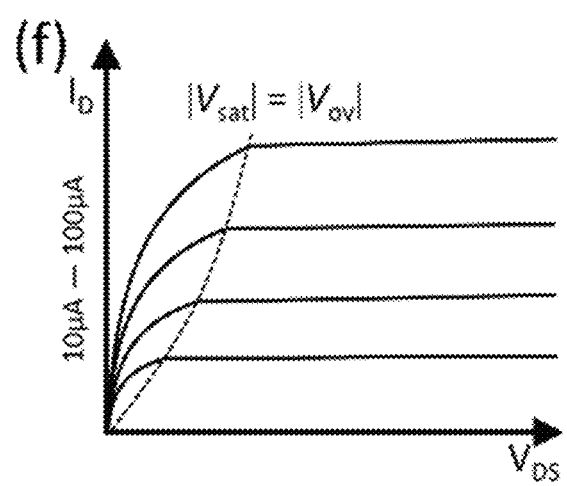
FIG. 4F shows output curves of the 1L-OFETs, according to an embodiment of the subject invention.

However, conventional OFETs as illustrated in FIG. 4A may suffer from the short-channel effects, resulting in incomplete pinch-off and elevated $g_d$ as shown in FIG. 4B. On the other hand, although the source-gated transistors (SGTs) shown in FIG. 4C can provide a small $g_d$, the charge depletion effect limits the drain-source current to a lower value as shown in FIG. 4D, which degrades the $g_m$ value and inhibits the device from fast operation. The 1L-OFETs are ideal for providing a high gain by short channels. For the intrinsic gain measurement, the device is operated under the saturation regime with a higher $V_{DS}$ range. The $V_{ov}$ value is limited to about −12.1 V and $V_{DS}$ value is limited to about −40 V to ensure that the differential output resistance may not be negative. The negative differential output resistance can be attributed to the high-current induced contact degradation, which will be discussed in the following sections.

Figure 4G:
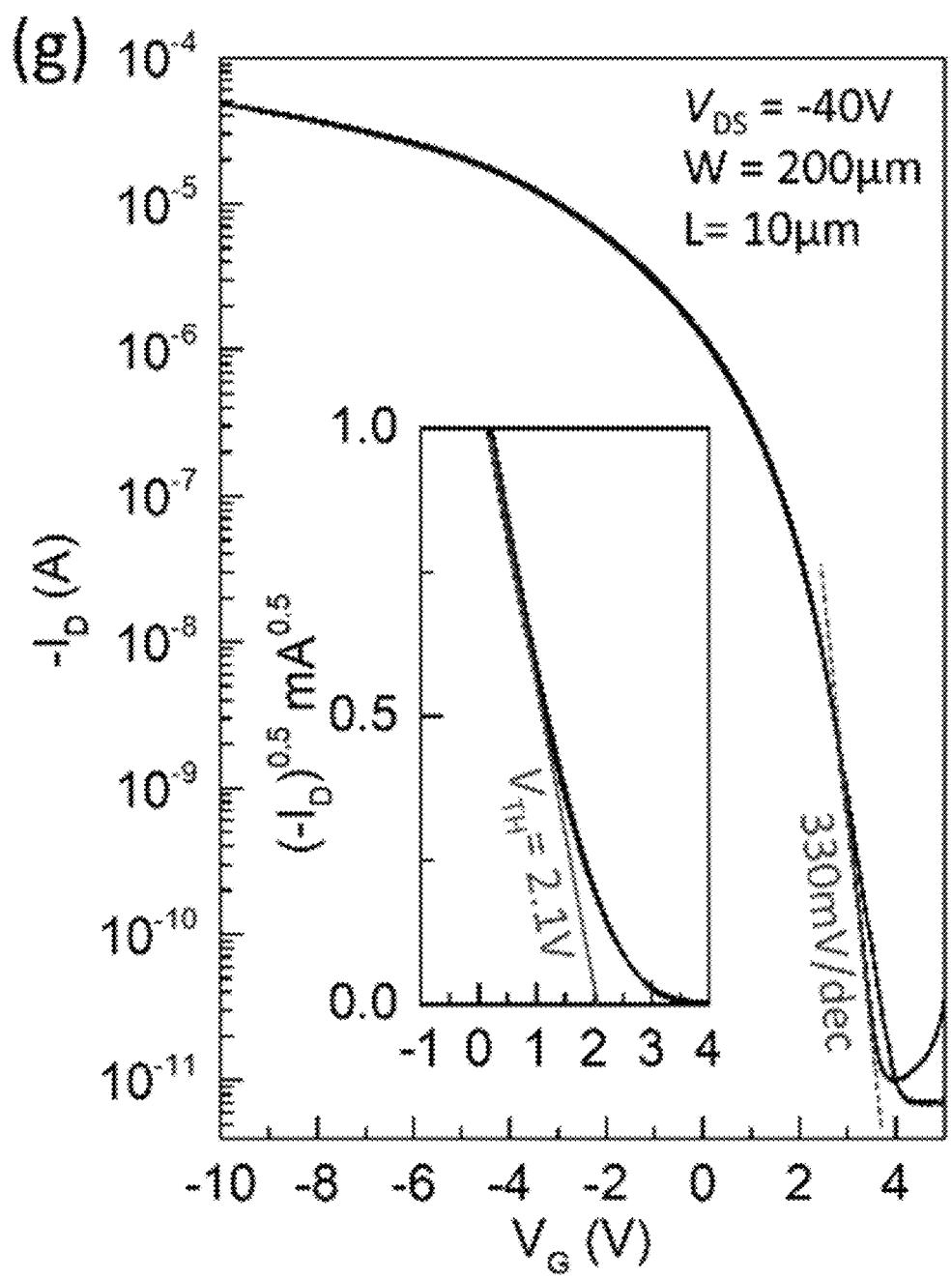
FIG. 4G shows the transfer curves of the 1L-devices at $V_{DS}$=−40 V, according to an embodiment of the subject invention.
Figure 4H:
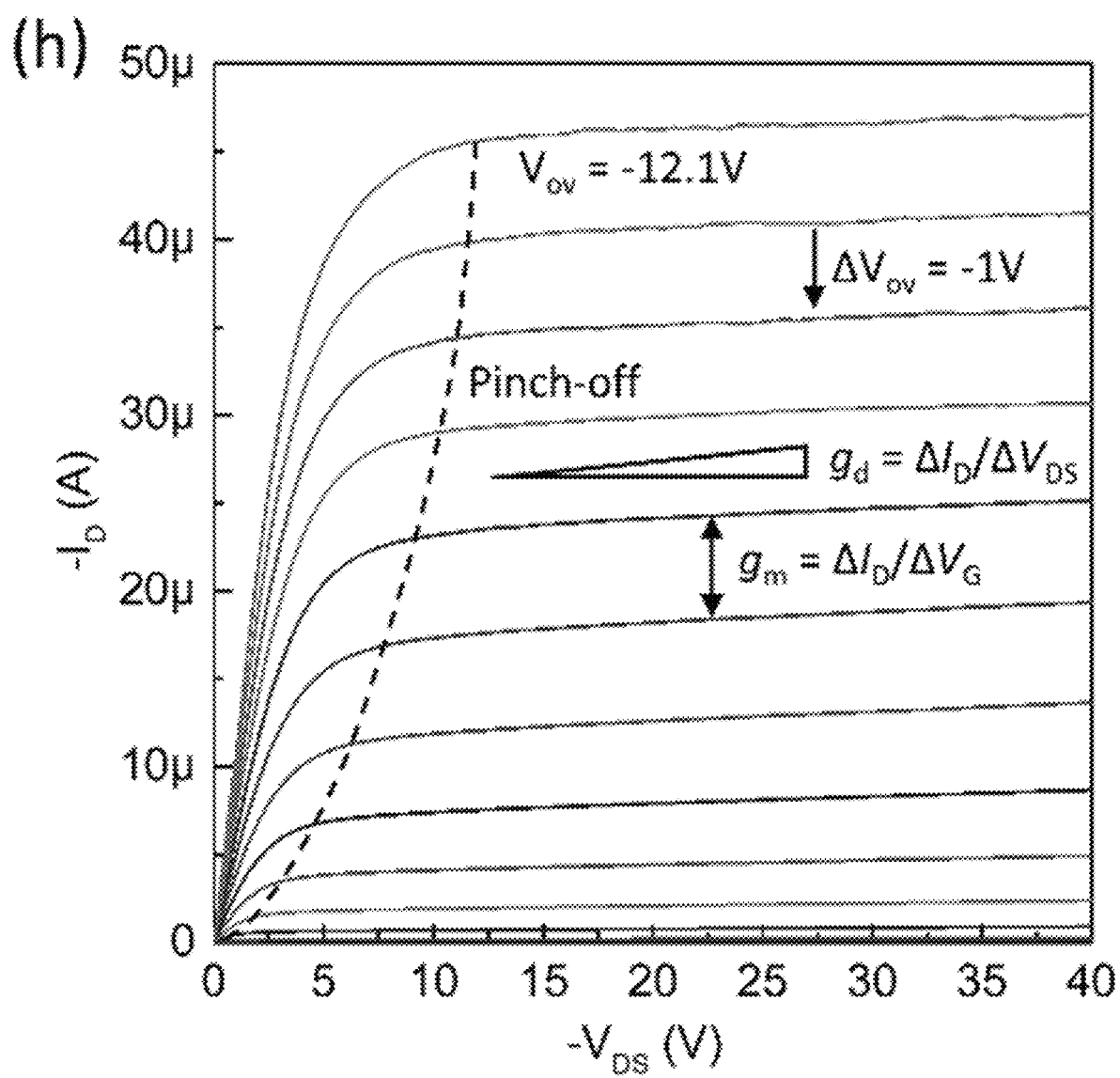
FIG. 4H shows the output curves of the 1L-OFET scanned from $V_{ov}$=−0.1 V to $V_{ov}$=−12.1 V with a step size of −1 V, according to an embodiment of the subject invention.
Figures 4I, 4J, 4K:
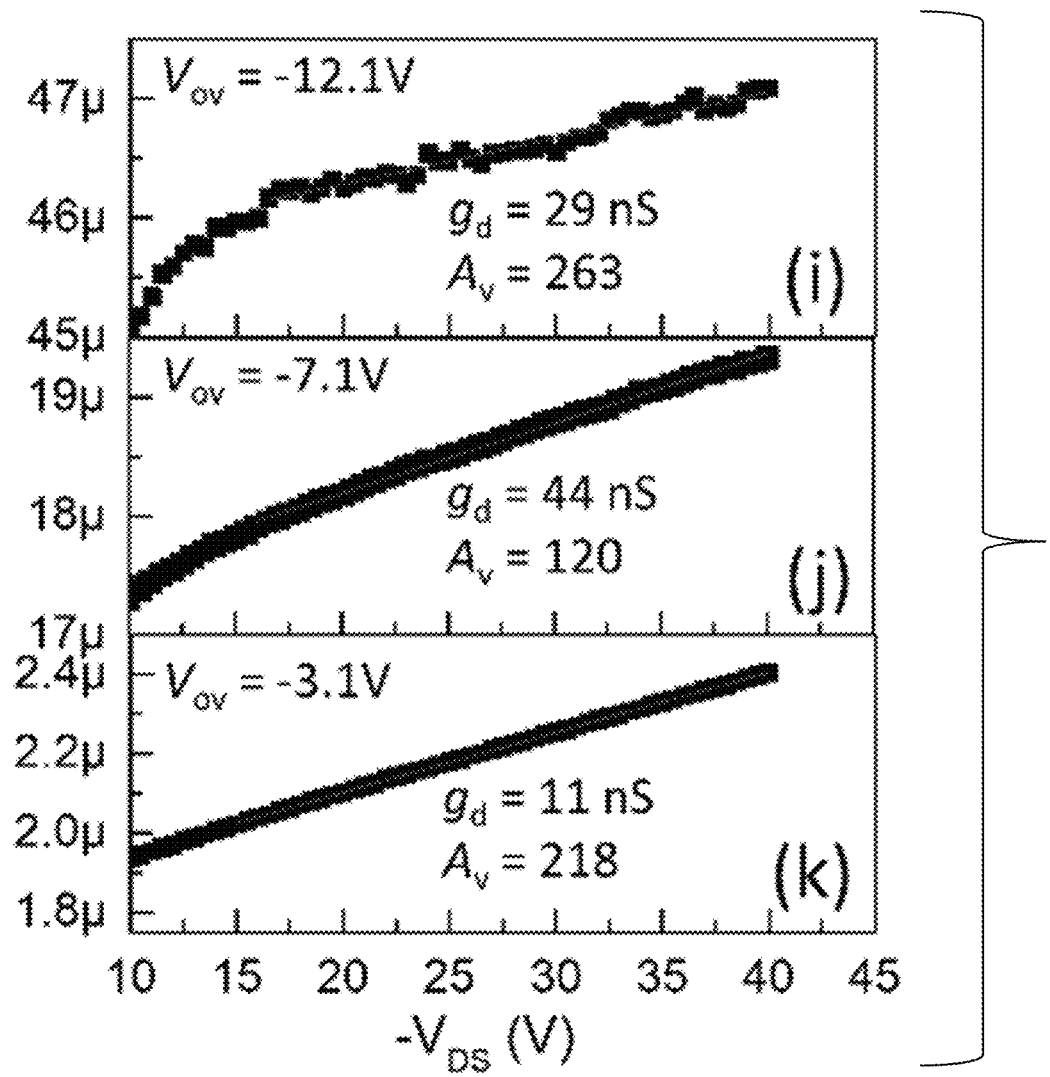
FIGS. 4I-4N show enlarged view of output curves to fit the $g_d$, according to an embodiment of the subject invention.
Figures 4L, 4M, 4N:
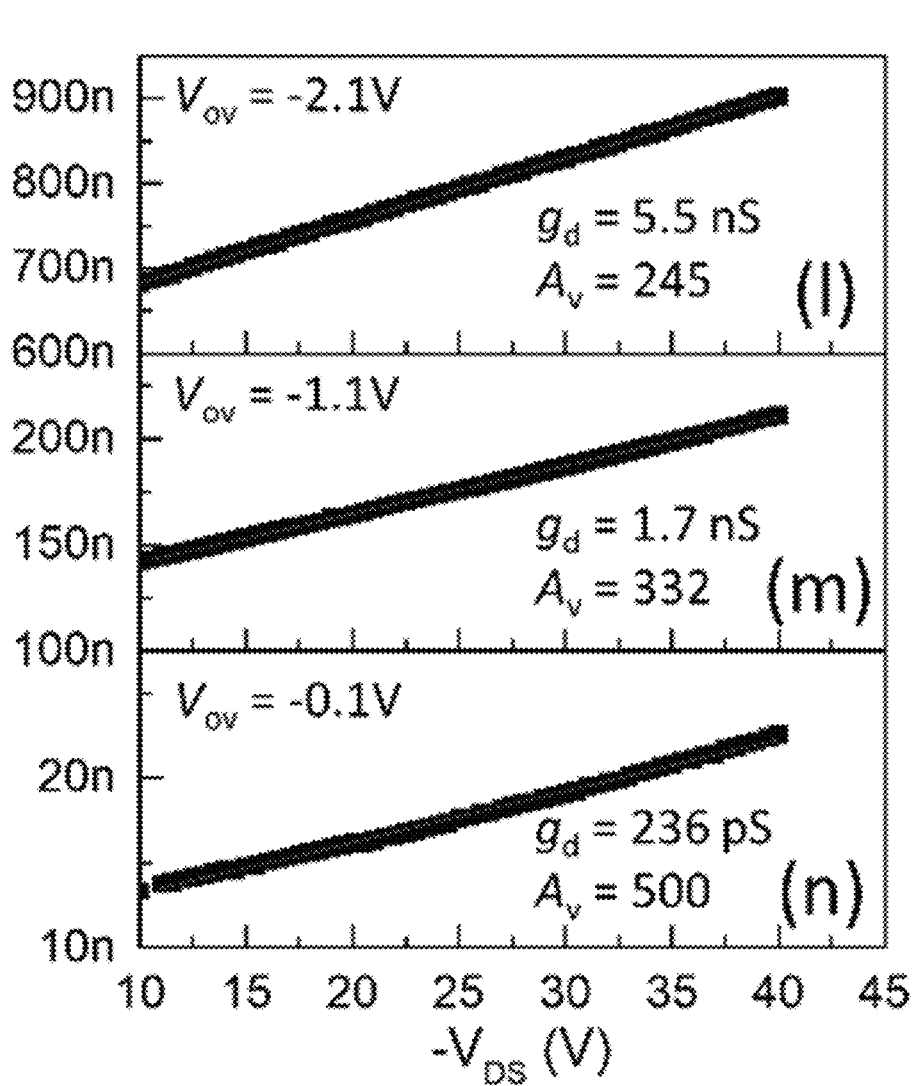

Similar to the linear regime, the transfer and output curves of a 1L-OFET in FIGS. 4G and 4H show a near-zero $V_{TH}$ (for example, 2.1 V), a small subthreshold swing (for example, 330 mV/dec), and a good pinch-off behavior. The $g_d$ values may be in a range from 236 pS to 44 nS, and the evaluated $A_v$ values may be in a range between 120 to 500 in the entire $V_{ov}$ range from −0.1 V to −12.1 V.

With the $g_m$ inherently higher than that of SGTs and the $g_d$ lower than that of OFETs with multilayer channel, the 1L-OFETs with intrinsic gain up to 500 may be applied to analog or digital circuits such as logic gates, ring oscillators, or rectifiers. Although a device with longer channel of 50 μm can further improve the intrinsic gain up to 735 under the same bias condition, the magnitude of the values is comparable with the short-channel device, proving the monolayer semiconductor is advantageous in improving the intrinsic gain in short-channel devices. It is noted that given $SiO_2$ is utilized as the material for the gate dielectric layer, changing the material of gate dielectric layer to high-k dielectric may further increase the $g_m$ and $A_v$ values by another one to two orders.

Current Saturation Effect at Large Bias

In addition to the intrinsic gain, the channel-width-normalized on-state drain current ($I_D/W$) is another effective parameter that is able to describe the capability of a transistor in transporting carriers and driving other electronic components. Herein, the long-channel (for example, with a 140 μm channel length) and short-channel (for example, with a 8 μm channel length) 1L-OFETs from the same monolayer single crystal are utilized to compare the $I_D/W$ values at a larger bias. At $V_{DS}$=-1 V and $V_G$=-80 V which are higher than the range for the $A_v$ evaluation, the short-channel device shows a $I_D/W$ value (0.59 μA/μm) that is one order of magnitude higher than that of the long-channel device (0.054 μA/μm), as indicated by the transfer curves in FIG. 15A.

Figure 15A:
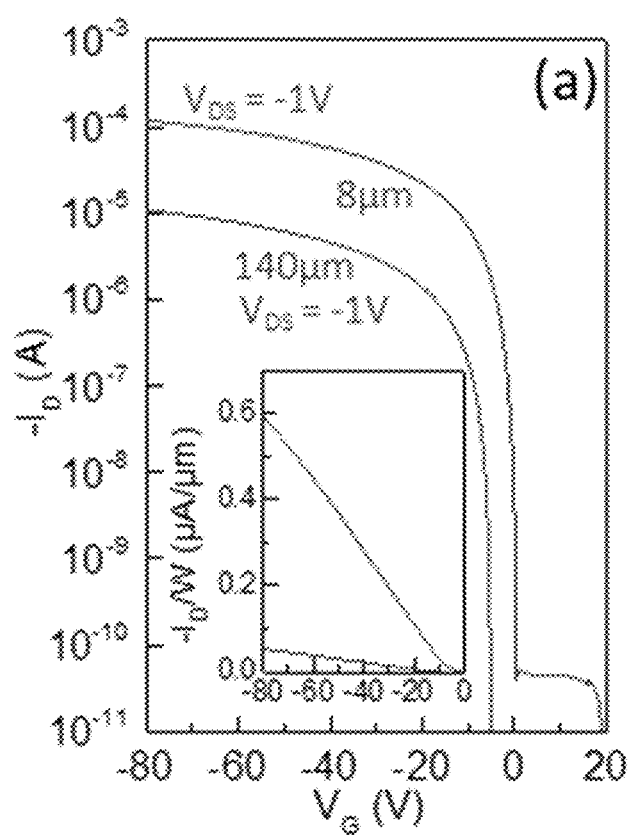
FIG. 15A shows the transfer curves in semi-log scale of short-channel (8 μm) and long-channel (140 μm) 1L-OFETs measured at small $V_{DS}$ bias, wherein the inset is the linear plot of width-normalized current density of the same devices, according to an embodiment of the subject invention.
Figure 15B:
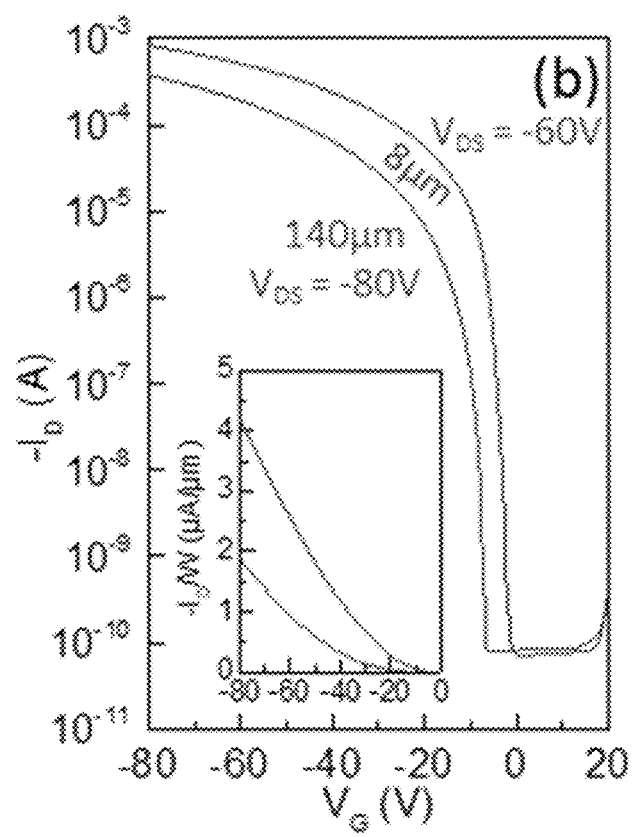
FIG. 15B show transfer curves in semi-log scale of short-channel (8 μm) and long-channel (140 μm) 1L-OFETs measured at a large Vis bias, wherein the inset is the linear plot of width-normalized current density of the same devices, according to an embodiment of the subject invention.

However, when a larger $V_{DS}$ is applied to further increase the $I_D/W$, the short-channel device shows only about 2 times (for example, 4.2 μA/μm as shown in FIG. 15B) $I_D/W$ compared with the long-channel one (for example, 1.9 μA/μm shown in FIG. 15B). The apparent linear mobility and the threshold voltage extracted from FIG. 15A are adapted to simulate the theoretical output curves of the devices indicated by dash lines in FIGS. 5A and 5B. For the long-channel device, the simulated output curves are in good agreement with the measured curves. However, the maximum $I_D/W$ value of the short-channel device is about 81% smaller than the simulated values (for example, 22 μA/μm). The drain-source current becomes saturated before it reached theoretical values.

Figure 5A:
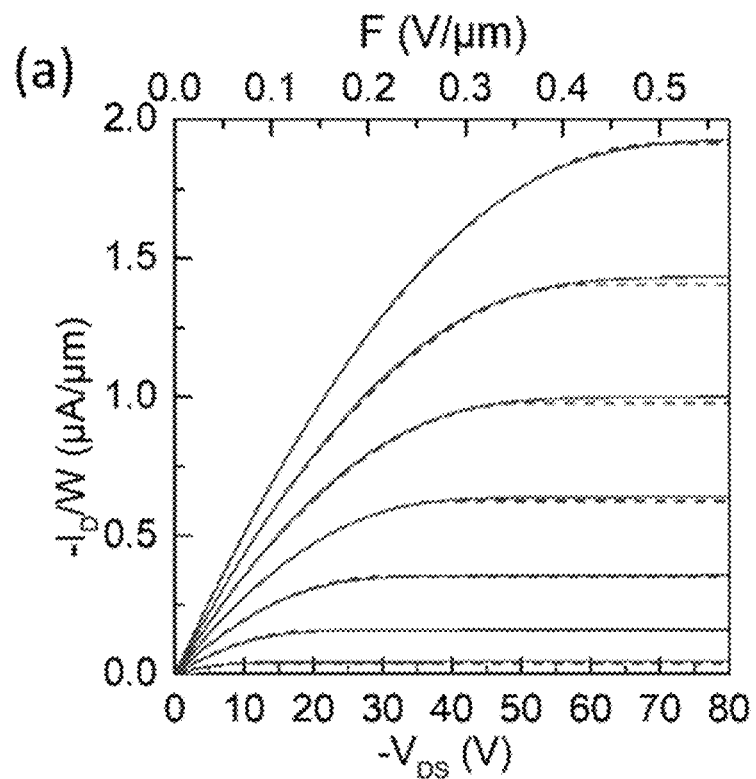
FIG. 5A shows the output curves (green solid lines) and simulated curves (green dashed lines) of a long-channel (140 μm as channel length) 1L-OFET at $V_G$ ranging from 0 V to −80 V (10 V step), according to an embodiment of the subject invention.
Figure 5B:
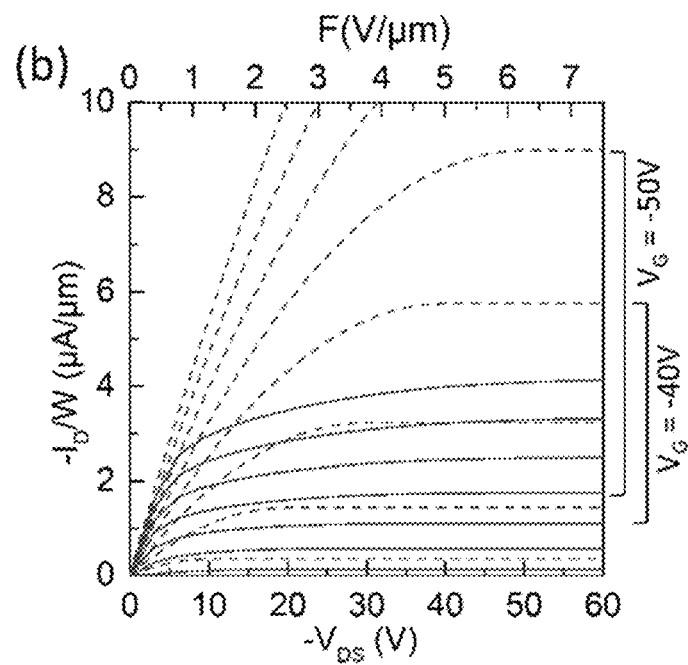
FIG. 5B shows the output curves (red solid lines) and simulated curves (red dashed lines) of a short-channel (8 μm as channel length) 1L-OFET at $V_G$ ranging from 0 V to −80 V (10 V step), according to an embodiment of the subject invention.
Figure 5C:
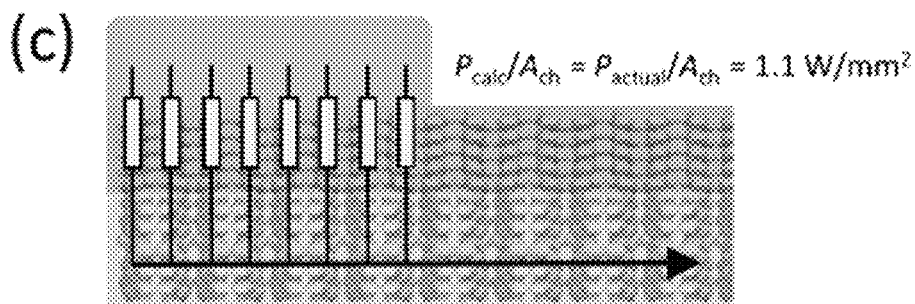
FIG. 5C shows a schematic representation of Ohmic contact of the long-channel device at the maximum current, according to an embodiment of the subject invention.

For the long-channel device as shown in FIG. 5C, the calculated and actual power density are 1.1 W/mm², while the actual power density for the short-channel device is 32 W/mm². If the theoretical current density (for example, 22 μA/μm) is used, the calculated power density would be as high as 165 W/mm², which is difficult for the OFETs to bear. In fact, even at the actual power density of 32 W/mm² which corresponds to 4.2 μA/μm, the devices have already shown signs of degradation.

Figure 5D:
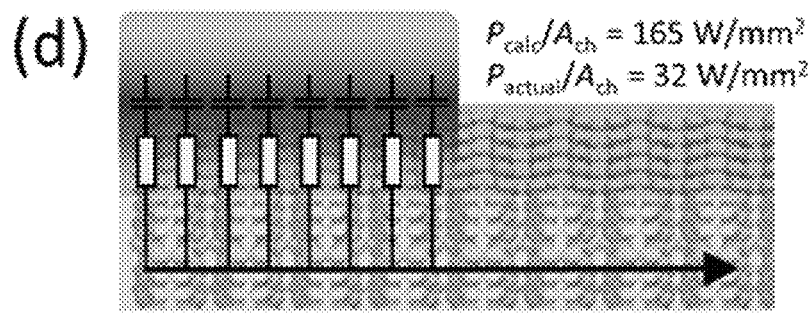
FIG. 5D shows a schematic representation of heat-induced deviation from Ohmic contact of the short-channel device at the maximum current, wherein P is calculated by $V_{DS} \cdot I_D$, and A is calculated by W·L, according to an embodiment of the subject invention.
Figure 5E:
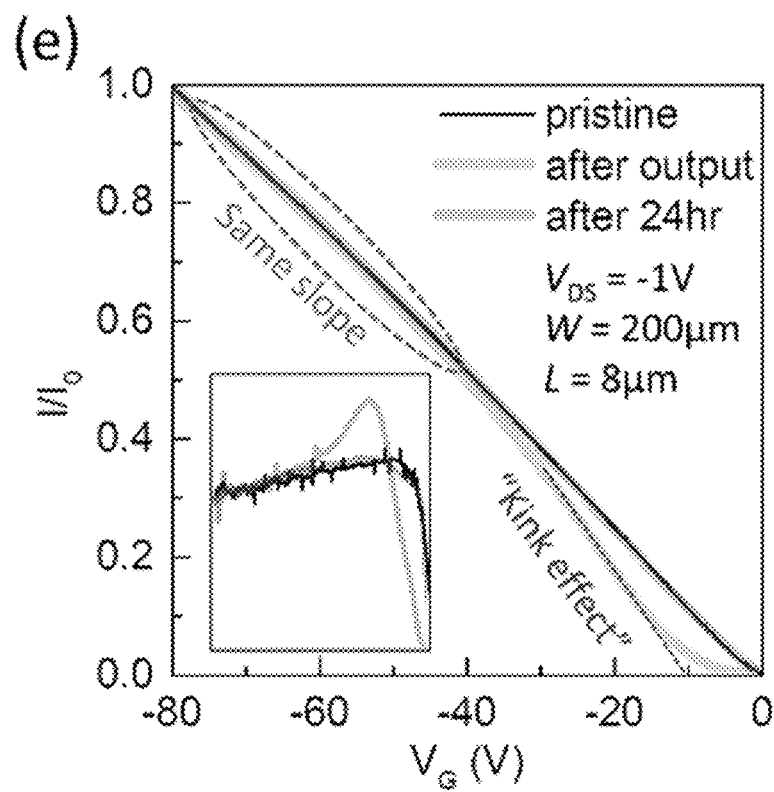
FIG. 5E shows forward-scan linear transfer curve of the short-channel device before performing any operations (black), right after the output scan in FIG. 5B (red), and after a storage of 24 hours with no operations (blue), according to an embodiment of the subject invention.

FIG. 5E shows the standard transfer curve in an Ohmic-contact linear shape for the 8-μm-channel-length device at $V_{DS}$=-1 V, before the output scan. However, after the output scan (for example, up to $V_{DS}$=-60V in FIG. 5B) performed on the same device, the transfer curve starts to deviate from the linear shape and an observable "kink" is present as indicated by the red line in FIG. 5E. The "kink" effect reveals that an extra capacitive term is induced at the contact in addition to the Ohmic term as shown in FIG. 5D. The slope of the two curves (pristine and after output scan) are almost the same (indicating identical mobility) at a larger $V_G$ bias, suggesting that the heat-induced change may happen at the M/OSC interfaces and may turn the contact into non-Ohmic.

Figure 16:
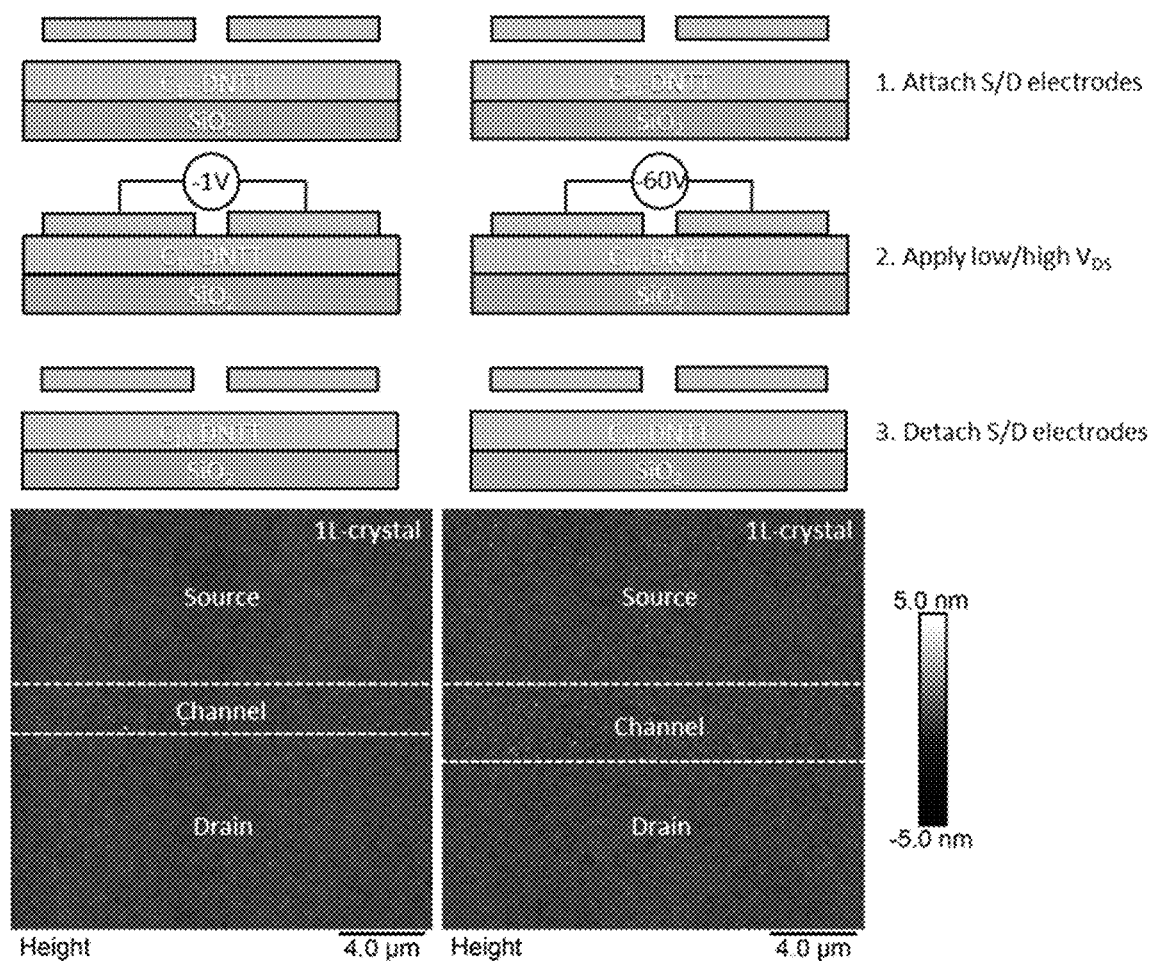
FIG. 16 is a schematic representation of morphology study on the 1L-crystal after applying low and high current, wherein the source-drain electrodes are laminated to construct short-channel 1L-OFETs, the 1L-OFETs are driven by low current (at $V_{DS}$=−1 V) and high current (at $V_{DS}$=−60 V), the source-drain electrodes are then detached and the 1L-crystals near the channel region are imaged by AFM, according to an embodiment of the subject invention.

The unfavorable degradation plays a significant role in the current saturation effect observed in the short-channel devices. This observation can be confirmed by two experiments. Firstly, the source/drain electrodes of the devices are peeled off after applying small and large $I_D/W$, and the monolayer is profiled under AFM. The AFM images in FIG. 16 suggest that the OSC layers are not degraded by the high current. Secondly, after the transfer curve deviated from the linear shape, the device is recovered to its original Ohmic behavior as indicated by the blue line in FIG. 5E after storage of 24 hours.

Figure 17:
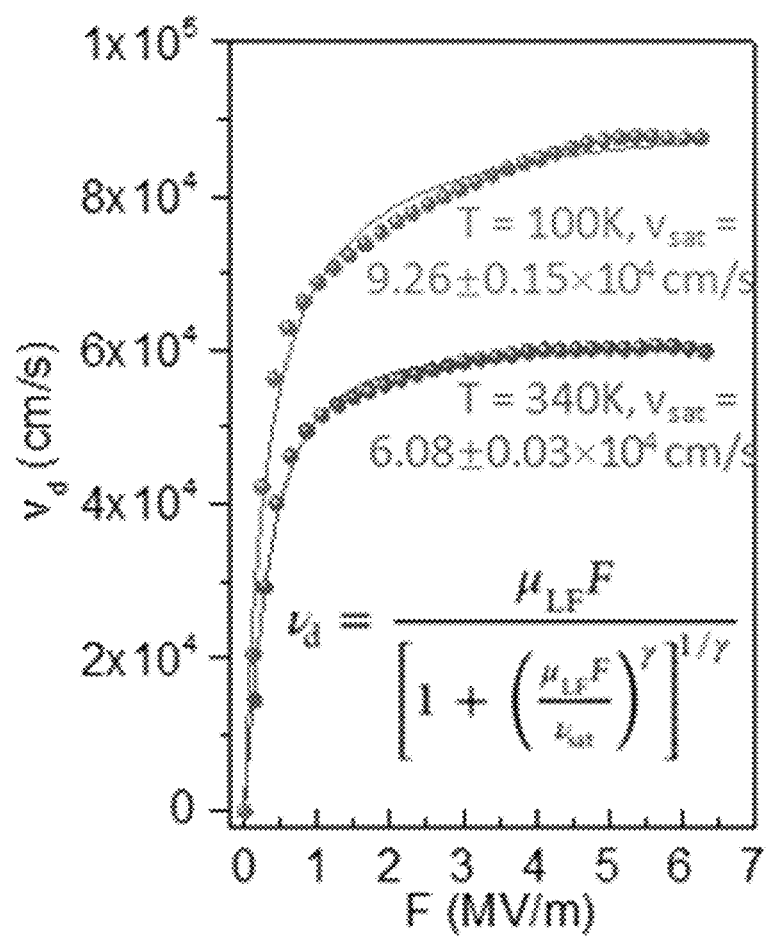
FIG. 17 shows a velocity saturation model of 8-μm device, wherein fittings on drifting velocity (as calculated from the measured output curves) by Caughey-Thomas model for the 8-μm device measured at 340 K and 100 K, the drain output current at $V_G$=−80 V is utilized for the fitting, according to an embodiment of the subject invention.

There are a number of factors limiting the drain current. First and the dominating one is the thermal degradations at the M/OSC interface caused by the high current density in the short-channel 1L-OFETs. The degradations act as a negative feed-back to the drain current, and the current is thus limited to certain values before it reaches theoretical values. The degraded interface adds extra capacitance to the overall contact. However, such degradation only limits at the M/OSC interface and is able to recover after a certain standby period. At the same time, the high current density achieved has not yet reached the physical limitation of organic semiconductor materials and the contact resistance (dynamic contact resistance during operation) is investigated. Secondly, due to the reverse bias nature, the capacitive effect at contact can also be induced by the formation of depletion region under the source contact. However, this depletion effect would disappear once the bias is removed. The relatively long recovery time in the device suggests the depletion effect is a less important reason for the current saturation in the short-channel 1L-OFETs. Lastly, similar to the recently reported transistors based on 2D material, as the applied drain-source field (F) is as large as 7.5 V/μm for the short-channel device, the velocity saturation effect behavior of the carriers may exist and increase the channel resistance. The analysis on velocity saturation effect is shown in FIG. 17.

Figure 18A:
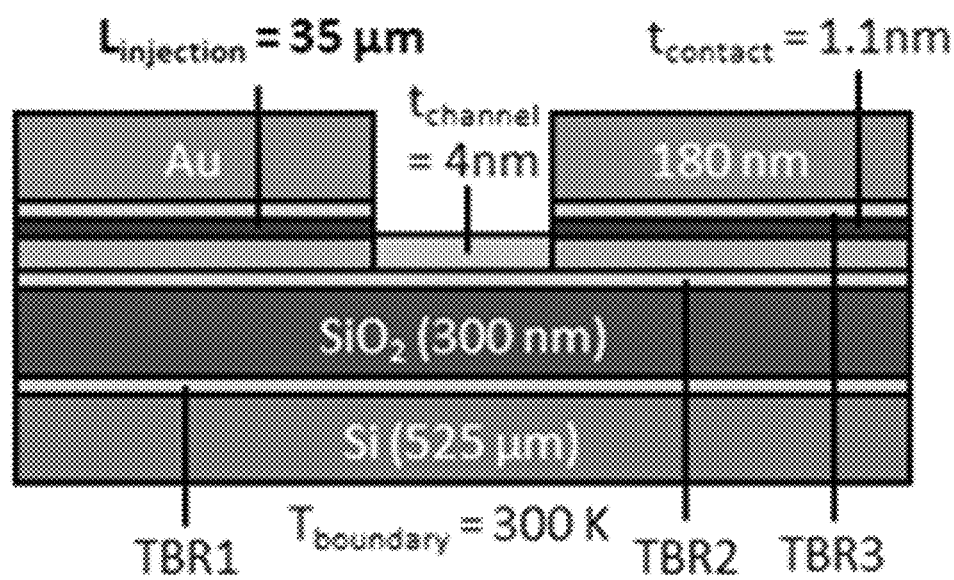
FIG. 18A is a schematic representation of layered structure of the simulated model for Linjection=35 μm, according to an embodiment of the subject invention.
Figure 18B:
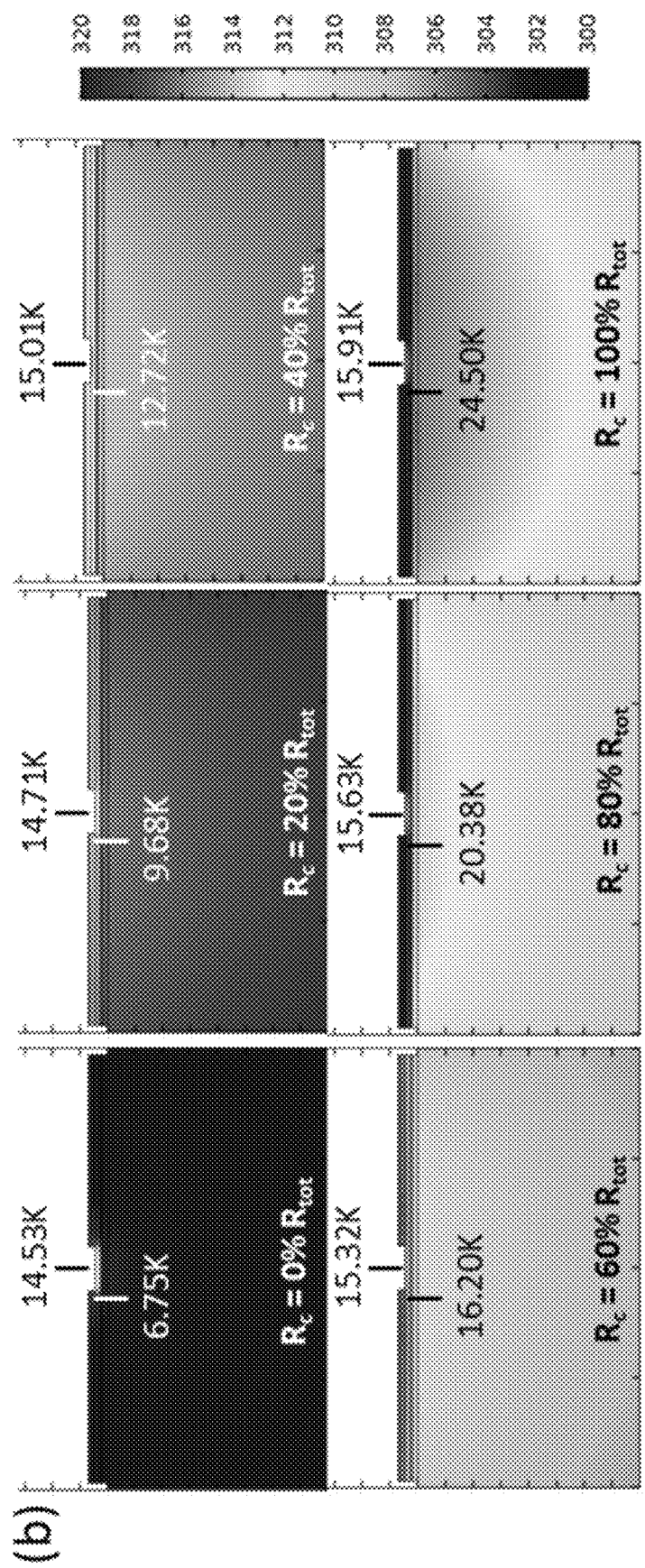
FIG. 18B shows thermal boundary resistance (TBR) modeled by a 1-μm-thick layer with fixed thermal resistance, wherein bottom boundary is fixed at 300 K, other boundaries are set as air convection (h=104 W/m2K), the temperature mapping or Rc=0%, 20%, 40%, 60%, 80%, and 100% of Rtot for Linjection=35 μm, VDS is −60 V, ID/W is 4.2 μA/μm, channel length L is 8 μm, and length of the source and drain electrodes is 35 μm, according to an embodiment of the subject invention.

The thermal behaviors of these monolayer transistors are discussed below. The thermal effects are usually ignored for the OFETs because of the low mobility and current. However, when the mobility and contact resistance keep showing promising improvement, these high-performance OFETs may face challenges from thermal aspects, where the mechanisms and physics may be very different with inorganic FETs. The self-heating effect in short-channel OFETs would limit the current density and demean the Ohmic contact into gated-Schottky contact. Herein, a finite element simulation is utilized to reveal the temperature rise of the OFETs during high-current operations. By assuming increasing proportion of $R_c$ in $R_{tot}$, the heating effect at the metal/semiconductor interfaces becomes more significant than that in the channel. The $\Delta T_{contact}$ (for example, from 6.75 K to 24.50 K) rises more rapidly than the $\Delta T_{channel}$ (for example, 14.53 K to 15.91 K) for the case of $L_{injection}$=35 μm (i.e. entire interface equally inject current), as shown in FIGS. 18A and 18B.

Figure 18C:
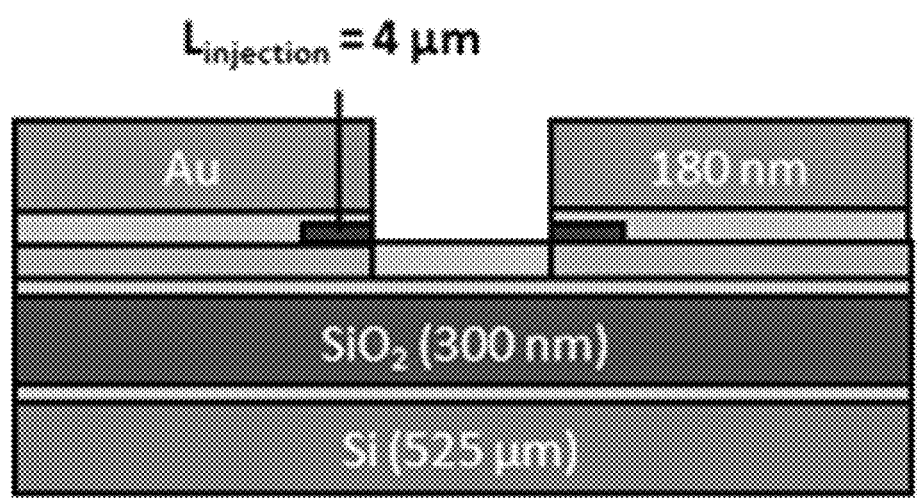
FIG. 18C is a schematic representation of layered structure of the simulated model for Linjection=4 μm, according to an embodiment of the subject invention.
Figure 18D:
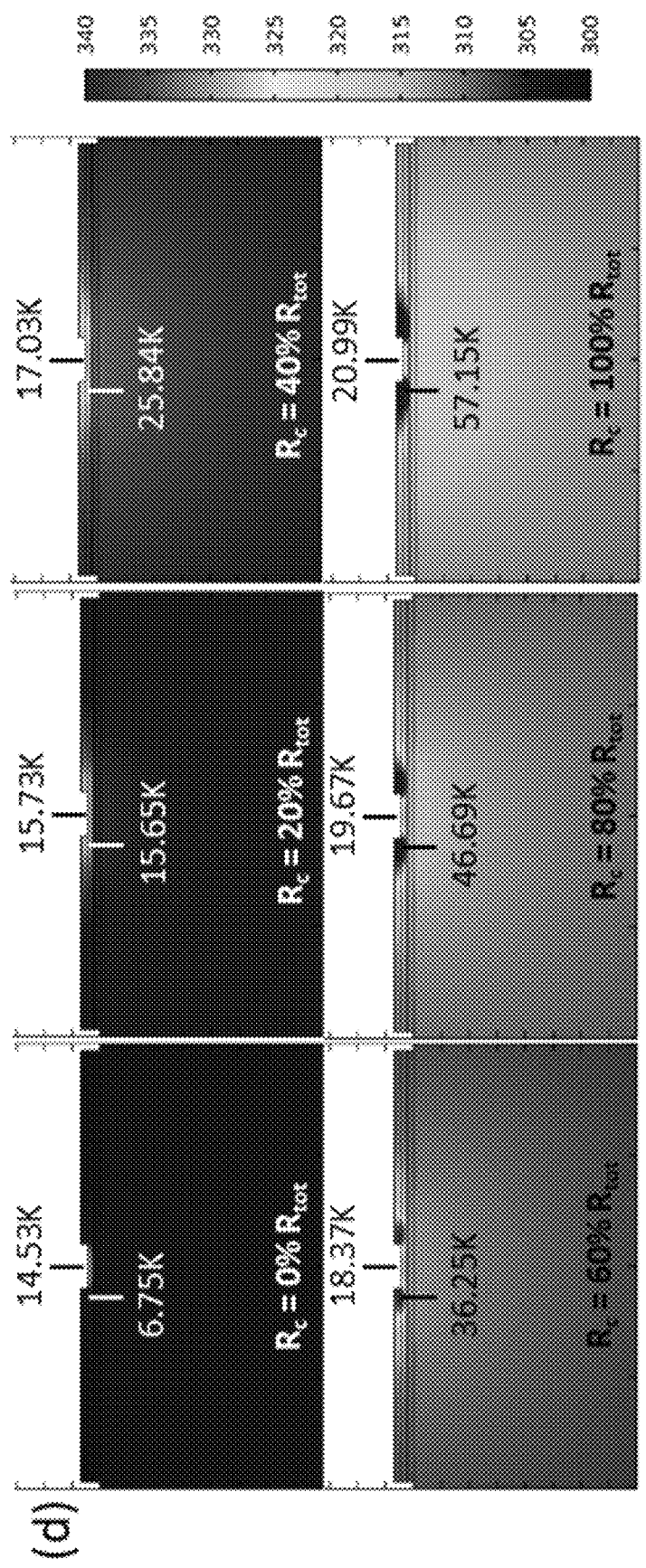
FIG. 18D shows TBR modeled by a 1-μm-thick layer with fixed thermal resistance, wherein bottom boundary is fixed at 300 K, other boundaries are set as air convection (h=104 W/m2K), temperature mapping or Rc=0%, 20%, 40%, 60%, 80%, and 100% of Rtot for Linjection=4 μm, VDS is −60 V, ID/W is 4.2 μA/μm, channel length L is 8 μm, and length of the source and drain electrodes is 35 μm, according to an embodiment of the subject invention.

If $L_{injection}=L_T/2\approx4$ μm is used to mimic the current crowding effect near the channel, the $\Delta T_{contact}$ may be as great as 57.15 K shown in FIGS. 18C and 18D. Such heating effect is sufficient to cause noticeable degradation of the metal/semiconductor interface. More importantly, the heating effect may be more severe if the flexible substrate (with thermal conductivity much lower than a Si wafer) is used and a large number of devices are integrated. These findings suggest that even when a low-contact-resistance OFET is achieved in the linear region operation, the thermal degradation at the contact induced by increased current density at higher bias may still be a bottleneck for these high-performance OFETs to operate. Apart from the breakthrough in mobility and contact resistance, further studies on the thermal behaviors are necessary for unleashing potentials of the organic transistors.

The monolayer single crystals as active layers are suitable for the staggered OFETs in terms of high mobility and low contact resistance. The lower mobility of monolayer OSCs compared with the thicker counterparts previously reported may arise from the thermal damage caused by the electrode deposition process. $R_c \cdot W$ as low as about 40 Ω·cm and $\mu_0$ of about 12.5 cm²V⁻¹s⁻¹ are achieved by the 1L-OFETs. The charge injection is mainly through field emission instead of thermionic emission when the channel is turned on, proving an apparent Ohmic contact of the 1L-devices. The 1L-OFET may operate linearly from $V_{DS}$=-1 V to $V_{DS}$ as small as -0.1 mV, and exhibit large intrinsic gain at saturation regime thanks to the good pinch-off behavior brought by the monolayer semiconductor. At a higher drain-source bias load, the 1L-OFET may transport with a current density as high as 4.2 μA/μm, with a current saturation effect being observed. Such high current density effect may only emerge with the fulfillment of: (i) high-mobility OSC crystals; (ii) low contact resistance; (iii) short channel length; and (iv) stable dielectric/OSC interface. The findings suggest that even when OFETs with low contact resistance are achieved, their degradations in high current operations may still limit their performances.

Experimental Section

Si wafers (for example, having a thickness of 525 µm, from Namkang Hi-Tech) with 300-nm-thick thermal oxide layer are cleaned by oxygen-plasma (for example, 30 W, from Harrick Plasma) for 30 minutes. The wafers are loaded into a vacuum oven with 50 µL (for example, from J&K Scientific) aside. The oven is evacuated to <0.01 bar, heated to 150° C., stayed at 150° C. for 60 minutes, and cooled to the room temperature. The RMS roughness of the PTS-treat $SiO_2$/Si wafers is about 0.28 nm (5 µm×5 µm area). The PTS-treated 300-nm-thick thermal $SiO_2$ has an area capacitance of 11 nF/cm$^2$ measured at 1 kHz.

During the solution-shearing process, the PTS-treated substrate and OTS (for example, from Sigma Aldrich) treated blades (also $SiO_2$/Si) are heated up to 60-65° C. A 40 µL $C_{10}$-DNTT solution (for example, 0.2 mg/ml in tetralin, heated to 70° C. to help dissolving) is injected between the substrates having a size of 2 cm by 2 cm and a blade having a width of 2 cm, the two being spaced apart from each other by a gap of 100 µm and at an angle of 15°. The shearing rate is controlled by a linear translation stage (for example, ILC 100 CC, New port) at about 2-3 µm/s, depending on whether the 1L or 2L crystals are needed. After the deposition, the samples are stored in a vacuum oven (OV-12, Jeio Tech) for at least overnight to remove the residual solvent. Before the electrode deposition or transfer, the 1L-crystals are transferred into a glovebox (for example, water and oxygen content lower than 1 ppm, from MBraun) and heated to 80° C. for 15 minutes to further remove adsorbed moisture and oxygen.

The Au electrodes (for example, 180 nm thick) are formed by thermal evaporation on OTS-treated $SiO_2$/Si wafers. The rectangular shape of Au stipes is formed by using special TEM grids as shadow masks. The resulting Au stripes each has a length of about 200 µm and a width of about 35 µm. The Au stripes are transferred in the ambient air by a probe station equipped with a microscope. The CuBe probe is controlled to lift one end of the Au stripe and slowly lift off the whole stripe. The freestanding stripe is then released onto the crystal surface to form the source and drain electrodes. When the stripes are to attach the surface of 1L-crystal, the length of the stirpes are controlled to be perpendicular to the a-axis of the crystal, detailed method in determining the a-axis is shown in FIG. 9. All the electrodes for OFETs with different channel lengths in the TLM configuration are ensured to be in a single crystal. After the attachment of Au electrodes, the testing area of 1L-crystal is carefully separated with the excess areas by a rigid probe to minimize the fringe current. Then the completed devices are transferred into the glove box, heated to 80° C. for 15 minutes, and stored at room temperature for overnight prior to electrical tests.

All measurements are performed in the glove box environment, except the low-temperature tests. A dual-channel sourcemeter (for example, from Keithley 2636A) is employed to test the transfer and output characters of the OFETs. The voltage scanning rate is set to be, for example, 10V/s for the forward and reverse transfer scan to ensure proper electrical contacts between the probes and the transferred electrodes. Flexible Au wires having, for example, a diameter of 15 µm are attached to the ends of the probes by conductive Ag paste. The TLM is performed by linear fitting of total channel resistance (width normalized) of OFETs with difference channel lengths at the same $V_{DS}$ and $V_{ov}$. The error bars in the TLM plots represent the resistance different in the forward and reverse bias (i. e. hysteresis). The error bars in the $R_c$ plots are calculated from the standard errors of regression slopes. For the low-temperature test, a thin layer of Cytop is formed by a spin coating of a 2.25 wt % Cytop solution at 2500 revolutions per minute (RPM) followed by an annealing at about 80° C. for about 1 hour. The vacuum cyrogeneic probestation is evacuated overnight to $<1\times10^{-3}$ Pa and liquid nitrogen is ejected to cool down the sample at a maximum cooling rate of about 1 K/min.

Supplement: Velocity Saturation Effect in 1L-OFETs

The velocity saturation effect describes a phenomenon that occurs when a high lateral field (F) is applied to the semiconductor. In a classic model, the drifting velocity of the carriers follows the Equation (3)

$$v_d = \mu_{LF} F \quad (3)$$

where $\mu_{LF}$ is the low-field mobility. This low-field mobility is consistent with the linear field-effect mobility (for example, $V_{DS}=-1$ V of FIG. 2E). However, when the lateral field exceeds a certain critical value, the drifting velocity is no longer linearly proportional to the lateral field. The increasing carrier-phonon scattering starts to limit the drifting velocity, making it saturate at a certain level defined as $v_{sat}$. In this case, the apparent mobility ($\mu_{HF}$, high-field mobility) decreases and the channel resistance increases. The critical lateral field ($F_{crit}$) to observe velocity saturation effect for the well-studied inorganic semiconductor materials (for example, $v_{sat}=0.7$–$1.0\times10^7$ cm/s for Silicon, and $3.4\times10^6$ cm/s for 1L-$MoS_2$) is 1-2 V/µm. For the long-channel (140 µm) device, no matter the device is operated under $V_{DS}=-1$ V or $-80$ V, the F is still smaller than 1 V/µm as shown by FIG. 5A, so that the current follows well with the standard linear to pinch-off behavior. On the other hand, for the short-channel (8 µm) device, the F is determined to be as high as 7.5 V/µm at $V_{DS}=-60$ V shown in FIG. 5B, which is sufficiently large to cause the velocity saturation effect. The Caughey-Thomas model and Equations (4)-(6) are applied to fit the output results of the short-channel device.

$$v_d = \frac{I_D}{WQ_{eff}} \quad (4)$$

$$Q_{eff} = C_i\left(V_G - V_{TH} - \frac{V_{DS}}{2}\right) \quad (5)$$

$$v_d = \frac{\mu_{LF}F}{\left[1+\left(\frac{\mu_{LF}F}{v_{sat}}\right)^\gamma\right]^{1/\gamma}} \quad (6)$$

For the output curves measured at T=340 K and $V_G=-80$ V, the fitted $v_{sat}$ is determined to be $6.08\pm0.03\times10^4$ cm/s, as shown in FIG. 17. The corresponding low-field mobility is determined to be $13.5\pm0.54$ cm$^2$V$^{-1}$s$^{-1}$, which agrees with the intrinsic mobility value measured at $V_{DS}=-1$ V. The $v_{sat}$ further increases to $9.26\pm0.15\times10^4$ cm/s at a lower temperature (for example, 100 K). The large lateral field and negative-temperature-dependent $v_{sat}$ suggest the possible velocity saturation effect in the short-channel device. The velocity saturation effect increases the channel resistance and may be one of the reasons for the observed current saturation effect.

Supplement: Modeling for the Channel Self-Heating Effect

To simulate the temperature rise of the device, COMSOL Multiphysics® is used to model the joule heating effect by applying inward heat flux into the semiconductor layer, at a constant ambient temperature and under forced air convection at corresponding boundaries.

The 2-D heat transfer of the device is investigated. First, a geometry is drawn according to the physical dimensions of each layer in the device. The dimensions of each layer are summarized in the following Tables 1 and 2.

TABLE 1

Modeling Geometry for the 8-μm Device.

| Material | Width | Thickness |
| --- | --- | --- |
| Silicon | 78 μm | 500 μm |
| Silicon Oxide | 78 μm | 300 nm |
| $C_{10}$-DNTT | 78 μm | 4 nm |
| Gold | 35 μm × 2 | 180 nm |

After the completion of the geometries, materials are added to the corresponding layers according to respective thermal properties. Meanwhile, thermal boundary layers are inserted between each contacted pair to represent the thermal boundary resistance (TBR). Herein, as the reported TBR values of organic semiconductor materials are insufficient. The TBR values are adopted from similar pair of materials. For example, the TBR between pentacene and $SiO_2$ is used to estimate the TBR between $C_{10}$-DNTT and $SiO_2$. The TBR between Ag and DNTT is used to represent the TBR between Au and $C_{10}$-DNTT. The thermal properties of each layer are summarized in the following Table 2.

TABLE 2

Material Parameters for the Model.

| Material | Thermal Conductivity k(W/m/K) | Density (kg/m$^3$) | Heat Capacity (J/kg/K) | Thermal Resistance $R_{th}$ (m$^2$K/W) |
| --- | --- | --- | --- | --- |
| Silicon | 130 | 2329 | 700 | 3.84 × 10$^{-6}$ |
| $SiO_2$-Si (TBR1) | N/A | N/A | N/A | 2 × 10$^{-9}$ |
| Silicon oxide | 1.4 | 2200 | 730 | 2.14 × 10$^{-7}$ |
| $C_{10}$-DNTT-$SiO_2$ (TBR2) | N/A | N/A | N/A | 1.6 × 10$^{-7}$ |
| $C_{10}$-DNTT | 0.31 | 1300 | 500 | 1.29 × 10$^{-8}$ |
| Gold- $C_{10}$-DNTT (TBR3) | N/A | N/A | N/A | 1.14 × 10$^{-7}$ |
| Gold | 317 | 19300 | 129 | 5.68 × 10$^{-10}$ |

After selecting the corresponding materials, inward heat flux, constant ambient temperature and natural air convection are added to be the corresponding boundary conditions. For the 8-μm device, an inward heat flux of $7.88 \times 10^{15}$ W/m$^3$ (corresponding to $P_{channel}$=32 W/mm$^2$) is added in the semiconductor layer. At the bottom of the substrate, a constant ambient temperature 300 K is set to model a perfect heat sink condition. The rest of the boundary conditions are set to be natural air convection. The coefficient of convection h is set to be $10^4$ W/m$^2$K.

Considering that the heating takes place both at channel and at the contact parts, different cases are simulated by assuming proportions of $R_c$ in $R_{tot}$ as 0%, 20%, 40%, 60%, 80%, and 100%. These values can be linearly converted to the input power ratio between the channel and contact. Difference with the volumetric power density for the channel part, the thickness of the contact is evaluated as 1.1 nm, which is the thickness of the upper alkyl chains. Two cases with $L_{injection}$ of 35 μm shown in FIG. 18B and 4 μm shown in FIG. 18D, which are the lower and higher limit of the heating effect, respectively, are simulated.

All patents, patent applications, provisional applications, and publications referred to or cited herein are incorporated by reference in their entirety, including all figures and tables, to the extent they are not inconsistent with the explicit teachings of this specification.

It should be understood that the examples and embodiments described herein are for illustrative purposes only and that various modifications or changes in light thereof will be suggested to persons skilled in the art and are to be included within the spirit and purview of this application. In addition, any elements or limitations of any invention or embodiment thereof disclosed herein can be combined with any and/or all other elements or limitations (individually or in any combination) or any other invention or embodiment thereof disclosed herein, and all such combinations are contemplated with the scope of the invention without limitation thereto.

REFERENCES

[1] C. Liu, Y. Xu, Y.-Y. Noh, Mater. Today 2015, 18, 79-96.
[2] D. Natali, M. Caironi, Adv. Mater. 2012, 24, 1357-1387.
[3] C. Liu, G. Li, R. Di Pietro, J. Huang, Y.-Y. Noh, X. Liu, T. Minari, Phys. Rev. Appl. 2017, 8, 034030.
[4] H. H. Choi, K. Cho, C. D. Frisbie, H. Sirringhaus, V. Podzorov, Nat. Mater. 2018, 17, 2-7.
[5] E. G. Bittle, J. I. Basham, T. N. Jackson, O. D. Jurchescu, D. J. Gundlach, Nat. Commun. 2016, 7, 10908.
[6] K. Pei, X. Ren, Z. Zhou, Z. Zhang, X. Ji, P. K. L. Chan, Adv. Mater. 2018, 30, 1706647.
[7] X. Ren, K. Pei, B. Peng, Z. Zhang, Z. Wang, X. Wang, P. K. L. Chan, Adv. Mater. 2016, 28, 4832-4838.
[8] H. Sirringhaus, Adv. Mater. 2005, 17, 2411-2425.
[9] T. Hamai, S. Arai, H. Minemawari, S. Inoue, R. Kumai, T. Hasegawa, Phys. Rev. Appl. 2017, 8, 054011.
[10] H. Dong, X. Fu, J. Liu, Z. Wang, W. Hu, Adv. Mater. 2013, 25, 6158-6183.
[11] X. Zhang, H. Dong, W. Hu, Adv. Mater. 2018, 30, e1801048.
[12] B. Stadlober, U. Haas, H. Gold, A. Haase, G. Jakopic, G. Leising, N. Koch, S. Rentenberger, E. Zojer, Adv. Func. Mater. 2007, 17, 2687-2692.
[13] Z. Zhou, Z. Zhang, Q. Wu, X. Ji, J. Wang, X. Zeng, S. P. Feng, P. K. L. Chan, ACS Appl. Mater. Interfaces 2018, 10, 35395-35403.
[14] M. C. Gwinner, R. D. Pietro, Y. Vaynzof, K. J. Greenberg, P. K. H. Ho, R. H. Friend, H. Sirringhaus, Adv. Func. Mater. 2011, 21, 1432-1441.
[15] A. Yamamura, S. Watanabe, M. Uno, M. Mitani, C. Mitsui, J. Tsurumi, N. Isahaya, Y. Kanaoka, T. Okamoto, J. Takeya, Sci. Adv. 2018, 4, eaao5758.
[16] B. K. Sarker, S. I. Khondaker, ACS Nano 2012, 6, 4993-4999.
[17] Z. Liu, M. Kobayashi, B. C. Paul, Z. Bao, Y. Nishi, Phys. Rev. B 2010, 82. 035311.
[18] N. B. Kotadiya, H. Lu, A. Mondal, Y. Ie, D. Andrienko, P. W. M. Blom, G. A. H. Wetzelaer, Nat. Mater. 2018, 17, 329-334.
[19] B. Peng, Z. Wang, P. K. L. Chan, J. Mater. Chem. C 2016, 4, 8628-8633.

[20] B. Peng, S. Huang, Z. Zhou, P. K. L. Chan, *Adv. Func. Mater.* 2017, 27, 1700999.

[21] Z. Zhou, Q. Wu, S. Wang, Y. T. Huang, H. Guo, S. P. Feng, P. K. L. Chan, *Adv. Sci.* 2019, 6, 1900775.

[22] M. Chen, B. Peng, S. Huang, P. K. L. Chan, *Adv. Func. Mater.* 2020, 30, 1905963

[23] X. Wang, K. D. Parrish, J. A. Malen, P. K. L. Chan, *Sci. Rep.* 2015, 5, 16095.

[24] J. Zhang, J. Wilson, G. Auton, Y. Wang, M. Xu, Q. Xin, A. Song, P. *Natl. Acad. Sci.* USA 2019, 116, 4843-4848.

[25] R. A. Sporea, K. M. Niang, A. J. Flewitt, S. R. P. Silva, *Adv. Mater.* 2019, 31, 1902551.

[26] K. Pei, M. Chen, Z. Zhou, H. Li, P. K. L. Chan, *ACS Appl. Electron. Mater.* 2019, 1, 379-388.

[27] S. Fabiano, C. Musumeci, Z. Chen, A. Scandurra, H. Wang, Y.-L. Loo, A. Facchetti, B. Pignataro, *Adv. Mater.* 2012, 24, 951-956.

[28] K. Asadi, Y. Wu, F. Gholamrezaie, P. Rudolf, P. W. M. Blom, *Adv. Mater.* 2009, 21, 4109-4114.

[29] L. Jiang, H. Dong, Q. Meng, H. Li, M. He, Z. Wei, Y. He, W. Hu, *Adv. Mater.* 2011, 23, 2059-2063.

[30] F. Zhang, C.-a. Di, N. Berdunov, Y. Hu, Y. Hu, X. Gao, Q. Meng, H. Sirringhaus, D. Zhu, *Adv. Mater.* 2013, 25, 1401-1407.

[31] Y. Zhang, J. Qiao, S. Gao, F. Hu, D. He, B. Wu, Z. Yang, B. Xu, Y. Li, Y. Shi, W. Ji, P. Wang, X. Wang, M. Xiao, H. Xu, J.-B. Xu, X. Wang, *Phys. Rev. Lett.* 2016, 116, 016602.

[32] Y. Shi, L. Jiang, J. Liu, Z. Tu, Y. Hu, Q. Wu, Y. Yi, E. Gann, C. R. McNeill, H. Li, W. Hu, D. Zhu, H. Sirringhaus, *Nat. Commun.* 2018, 9, 2933.

[33] M. Li, D. K. Mangalore, J. Zhao, J. H. Carpenter, H. Yan, H. Ade, H. Yan, K. Mullen, P. W. M. Blom, W. Pisula, D. M. de Leeuw, K. Asadi, *Nat. Commun.* 2018, 9, 451.

[34] M. Li, T. Marszalek, Y. Zheng, I. Lieberwirth, K. Mullen, W. Pisula, *ACS Nano* 2016, 10, 4268-4273.

[35] L. Li, P. Gao, K. C. Schuermann, S. Ostendorp, W. Wang, C. Du, Y. Lei, H. Fuchs, L. D. Cola, K. Müllen, L. Chi, *J. Am. Chem. Soc.* 2010, 132, 8807-8809.

[36] D. He, J. Qiao, L. Zhang, J. Wang, T. Lan, J. Qian, Y. Li, Y. Shi, Y. Chai, W. Lan, L. K. Ono, Y. Qi, J.-B. Xu, W. Ji, X. Wang, *Sci. Adv.* 2017, 3, e1701186.

[37] I. N. Hulea, S. Russo, A. Molinari, A. F. Morpurgo, *Appl. Phys. Lett.* 2006, 88, 113512.

[38] S. Singh, S. K. Mohapatra, A. Sharma, C. Fuentes-Hernandez, S. Barlow, S. R. Marder, B. Kippelen, *Appl. Phys. Lett.* 2013, 102, 153303.

[39] P. Darmawan, T. Minari, Y. Xu, S.-L. Li, H. Song, M. Chan, K. Tsukagoshi, *Adv. Func. Mater.* 2012, 22, 45774583.

[40] S. Choi, C. Fuentes-Hernandez, C.-Y. Wang, T. M. Khan, F. A. Larrain, Y. Zhang, S. Barlow, S. R. Marder, B. Kippelen, *ACS Appl. Mater. Interfaces* 2016, 8, 24744-24752.

[41] U. Kraft, K. Takimiya, M. J. Kang, R. Rödel, F. Letzkus, J. N. Burghartz, E. Weber, H. Klauk, *Org. Electron.* 2016, 35, 33-40.

[42] Y. Chen, R. Ren, H. Pu, X. Guo, J. Chang, G. Zhou, S. Mao, M. Kron, J. Chen, *Sci. Rep.* 2017, 7, 10974.

[43] T. Kamiya, K. Nomura, H. Hosono, *Sci. Technol. Adv. Mater.* 2010, 11, 044305.

[44] H. Yoshizawa, Y. Huang, G. C. Temes, *IEEE International Symposium on Circuits and Systems.* 1997, 457.

[45] F. Yan, Y. Wang, J. Zhang, Z. Lin, J. Zheng, F. Huang, *ChemSusChem* 2014, 7, 101-104.

[46] C. Jiang, H. W. Choi, X. Cheng, H. Ma, D. Hasko, A. Nathan, *Science* 2019, 363, 719-723.

[47] Z. R. Wang, J. Z. Xin, X. C. Ren, X. L. Wang, C. W. Leung, S. Q. Shi, A. Ruotolo, P. K. L. Chan, *Org. Electron.* 2012, 13, 1223-1228.

[48] Z. Wang, X. Ren, C. W. Leung, S. Shi, P. K. L. Chan, *J. Mater. Chem. C,* 2013, 1, 3825-3832

[49] K. K. H. Smithe, C. D. English, S. V. Suryavanshi, E. Pop, *Nano Lett.* 2018, 18, 4516-4522.

[50] C. Canali, C. Jacoboni, F. Nava, G. Ottaviani, A. Alberigi-Quaranta, *Phys. Rev. B* 1975, 12, 2265-2284.

[51] X. Wang, J. Zhang, Y. Chen, P. K. L. Chan, *Nanoscale,* 2017, 9, 2262-2271.

The invention claimed is:

1. A method for manufacturing a semiconductor device having an organic semiconductor material, the method comprising:

performing a large-area solution shearing step to form a monolayer (1L) or bi-layer (2L) $C_{10}$-DNTT crystals with low shearing speed; and transferring Au electrodes onto the 1L or 2L $C_{10}$-DNTT crystals to build metal/semiconductor interfaces free of thermal damage.

2. The method of claim 1, wherein the large-area solution shearing step is performed at a temperature in a range between about 60° C. and about 65° C.

3. The method of claim 1, wherein the solution shearing is performed with both a shearing blade and a substrate heated to maintain a uniform temperature within the solution.

4. The method of claim 3, wherein the blade is an OTS-treated blade and/or the substrate is a PTS-treated substrate.

5. The method of claim 1, wherein an organic semiconductor solute is dissolved at a temperature of about 65° C. in 1,2,3,4-tetrahydronaphthalene solvent with a concentration of 0.2 mg/ml to form the solution.

6. The method of claim 5, wherein the solution is injected between a substrate and a blade.

7. The method of claim 1, wherein the large-area solution shearing step is performed with a shearing speed in a range between about 2 μm/s and about 3 μm/s.

8. The method of claim 1, wherein the 1L or 2L crystals have single-crystalline domains extending over several millimeters.

9. The method of claim 1, wherein the Au electrodes are transferred onto the 1L or 2L $C_{10}$-DNTT crystals by thermal evaporation.

10. The method of claim 1, wherein the Au electrodes are transferred onto the 1L or 2L $C_{10}$-DNTT crystals by a polymethyl methacrylate (PMMA) stamp.

11. An organic field-effect transistor (OFET), comprising an active layer comprising a monolayer (1L) or bi-layer (2L) $C_{10}$-DNTT crystals formed according to the method of claim 1.

12. The OFET of claim 11, wherein the OFET is constructed so that a channel length is along an a-axis of the monolayer (1L) or bi-layer (2L) $C_{10}$-DNTT crystals.

13. The OFET of claim 12, wherein the channel length of the OFET is in a range of 8 μm to 140 μm.

14. The OFET of claim 11, wherein the large-area solution shearing step is performed at a temperature in a range between about 60° C. and about 65° C.

15. The OFET of claim 11, wherein the solution shearing is performed with both a shearing blade and a substrate heated to maintain a uniform temperature within the solution.

16. The OFET of claim 15, wherein the blade is an OTS-treated blade and/or the substrate is a PTS-treated substrate.

17. The OFET of claim 11, wherein an organic semiconductor solute is dissolved at a temperature of about 65° C. in 1,2,3,4-tetrahydronaphthalene solvent with a concentration of 0.2 mg/ml to form the solution.

18. The OFET of claim 17, wherein the solution is injected between the substrate and the blade.

19. The OFET of claim 11, wherein the large-area solution shearing step is performed with a shearing speed in a range between about 2 μm/s and about 3 μm/s.

20. The OFET of claim 11, wherein the 1L or 2L crystals have single-crystalline domains extending over several millimeters.

21. The OFET of claim 11, further comprising Au electrodes transferred onto the 1L or 2L $C_{10}$-DNTT crystals.

22. The OFET of claim 21, wherein the Au electrodes are transferred onto the 1L or 2L $C_{10}$-DNTT crystals by thermal evaporation.

23. The OFET of claim 21, wherein the Au electrodes are transferred onto the 1L or 2L $C_{10}$-DNTT crystals by a polymethyl methacrylate (PMMA) stamp.

\* \* \* \* \*